(12) United States Patent
Terashima

(10) Patent No.: US 11,670,634 B2
(45) Date of Patent: Jun. 6, 2023

(54) SEMICONDUCTOR DEVICE

(71) Applicant: Mitsubishi Electric Corporation, Tokyo (JP)

(72) Inventor: Tomohide Terashima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 48 days.

(21) Appl. No.: 16/736,489

(22) Filed: Jan. 7, 2020

(65) Prior Publication Data
US 2020/0335496 A1 Oct. 22, 2020

(30) Foreign Application Priority Data

Apr. 18, 2019 (JP) .............................. JP2019-079495

(51) Int. Cl.
H01L 27/06 (2006.01)
H01L 29/78 (2006.01)
(Continued)

(52) U.S. Cl.
CPC ...... H01L 27/0635 (2013.01); H01L 29/7302 (2013.01); H01L 29/7805 (2013.01);
(Continued)

(58) Field of Classification Search
CPC ............. H01L 27/0635; H01L 27/0727; H01L 27/0716; H01L 27/0207; H01L 29/7813;
(Continued)

(56) References Cited

U.S. PATENT DOCUMENTS 5,631,487 A * 5/1997 Hattori ................ H01L 29/7816
257/E29.066
5,750,429 A * 5/1998 Kushida ............ H01L 29/66712
257/E29.066
(Continued)

FOREIGN PATENT DOCUMENTS

JP S58-218173 A 12/1983
JP H07-045826 A 2/1995
JP 2016-167537 A 9/2016

OTHER PUBLICATIONS

D. Fuoss, "Vertical DMOS Power Field-Effect Transistors Optimized For High-Speed Operation", IEDM Tech. Digest, pp. 250-253, 1982.
(Continued)

Primary Examiner — Sitaramarao S Yechuri
(74) Attorney, Agent, or Firm — Studebaker & Brackett PC

(57) ABSTRACT

There are provided a transistor including a first semiconductor layer of a first conductivity type, a second semiconductor layer thereabove, a first impurity region of a second conductivity type provided in an upper layer part of the second semiconductor layer, a second impurity region of a first conductivity type provided in an upper layer part of the first impurity region, a gate electrode facing the first impurity region and the second semiconductor layer with a gate insulating film interposed in between, and first and second main electrodes; a parasitic transistor with the second impurity region as a collector, the first and the second semiconductor layers as an emitter, and the first impurity region as a base; a parasitic diode with the first impurity region as an anode, and the first and the second semiconductor layers as a cathode; and a pn junction diode with the first impurity region as an anode, and the second impurity region as a cathode.

13 Claims, 20 Drawing Sheets

(51) Int. Cl.
*H01L 29/73* (2006.01)
*H01L 29/861* (2006.01)
*H01L 29/872* (2006.01)

(52) U.S. Cl.
CPC ...... *H01L 29/7806* (2013.01); *H01L 29/7813* (2013.01); *H01L 29/8611* (2013.01); *H01L 29/872* (2013.01)

(58) Field of Classification Search
CPC ............. H01L 29/7805; H01L 29/7302; H01L 29/8611; H01L 29/872; H01L 29/7806; H01L 29/0603; H01L 29/7803; H01L 29/0869; H01L 29/1608; H01L 29/165; H01L 29/0696; H01L 29/7802; H01L 29/7804; H01L 29/0684; H02M 7/537
See application file for complete search history.

(56) References Cited

U.S. PATENT DOCUMENTS

| | | | | |
|---|---|---|---|---|
| 7,417,266 | B1* | 8/2008 | Li | H01L 29/1095 |
| | | | | 257/E29.066 |
| 2002/0179968 | A1* | 12/2002 | Pfirsch | H01L 29/7802 |
| | | | | 257/E29.066 |
| 2006/0244060 | A1* | 11/2006 | Kapels | H01L 29/167 |
| | | | | 257/E21.162 |
| 2007/0045727 | A1* | 3/2007 | Shiraishi | H01L 29/7806 |
| | | | | 257/E29.066 |
| 2008/0102587 | A1* | 5/2008 | Seo | H01L 21/76814 |
| | | | | 257/E21.336 |
| 2008/0246086 | A1* | 10/2008 | Korec | H01L 29/7816 |
| | | | | 257/E29.066 |
| 2009/0039456 | A1* | 2/2009 | Bhalla | H01L 29/872 |
| | | | | 257/E27.068 |
| 2011/0073938 | A1* | 3/2011 | Takahashi | H01L 29/7811 |
| | | | | 257/328 |
| 2013/0026568 | A1* | 1/2013 | Bhalla | H01L 29/7806 |
| | | | | 257/337 |

OTHER PUBLICATIONS

An Office Action; "Notice of Reasons for Refusal", mailed by the Japanese Patent Office dated Mar. 8, 2022 which corresponds to Japanese Patent Application No. 2019-079495 and is related to U.S. Appl. No. 16/736,489; with English language translation.

An Office Action; "Notice of Reasons for Refusal," mailed by the Japanese Patent Office dated Jul. 5, 2022, which corresponds to Japanese Patent Application No. 2019-079495 and is related to U.S. Appl. No. 16/736,489; with English language translation.

* cited by examiner

F I G. 25
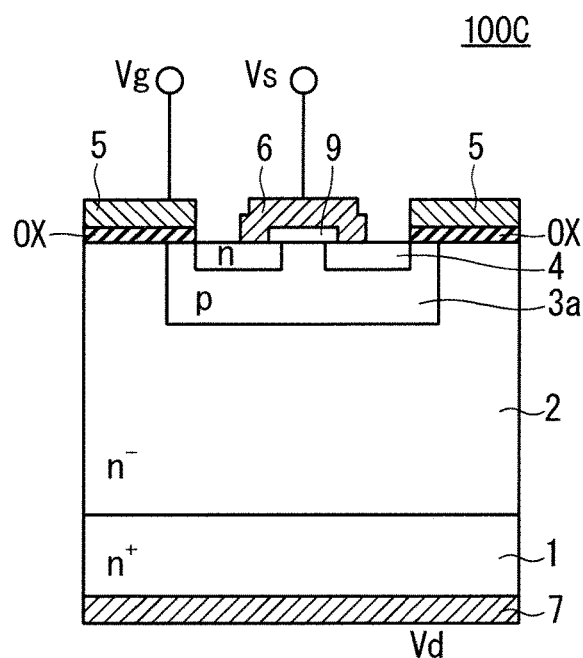
F I G. 26
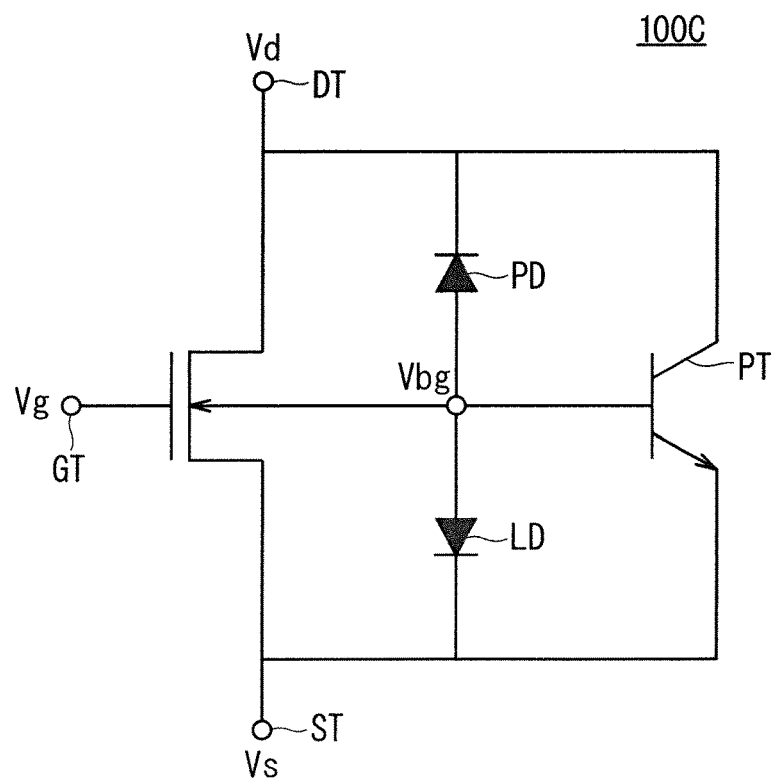

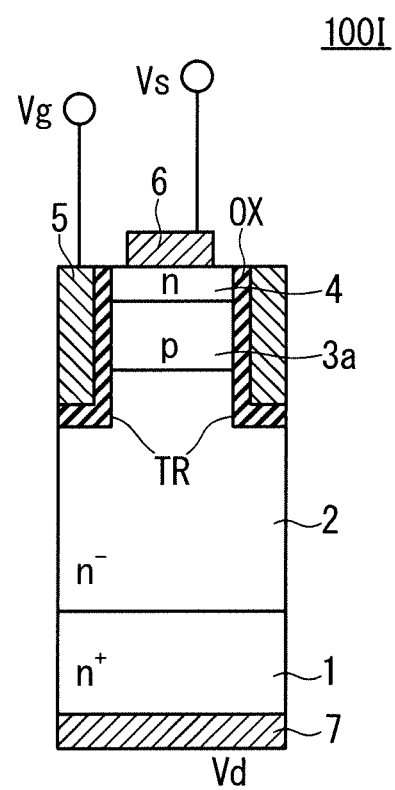
F I G. 3 9

(12)   US 11,670,634 B2

SEMICONDUCTOR DEVICE

BACKGROUND OF THE INVENTION

Field of the Invention

The present invention relates to a semiconductor device.

Description of the Background Art

As one form of a power metal oxide semiconductor field effect transistor (MOSFET), for example, there is a vertical double-diffused MOSFET (VDMOS) shown in FIG. 1 of D. FUOSS, "Vertical DMOS Power Field Effect Transistors Optimized For High-Speed Operation" IEDM Tech. Digest, P250, 1982. In VDMOS, a p-type impurity region and an n-type impurity region are formed by double diffusion on an upper layer part of an n-type epitaxial layer formed on a substrate containing a relatively high concentration ($n^+$) of n-type impurities. In addition, a gate electrode is provided so as to straddle the p-type impurity region and the n-type epitaxial layer with a gate oxide film interposed in between, a source electrode is connected to the n-type impurity region, and a drain electrode is provided on a main surface of the substrate opposite to a side provided with the source electrode.

In an inverter configured by connecting two power MOSFETs in series between PN lines, there is a case where a parasitic diode of the MOSFET is used as a freewheeling diode to cause forward bias operation, and an operation (synchronous rectification operation) of keeping a gate in the ON state for a certain period is generally performed in order to suppress a forward bias voltage (Vf) generated in the diode and reduce energy loss. However, in order to inhibit a short circuit (power supply short circuit) between the PN lines, it is necessary to return the gate to the OFF state before and after this operation. Therefore, the forward bias operation of the parasitic diode occurs at a time before and after this operation.

When the parasitic diode is forward-biased, hole injection into the n-type epitaxial layer occurs, and the injected holes may transiently flow reversely to cause energy loss when the parasitic diode returns to the reverse bias again.

In addition, in SiC semiconductor devices made of silicon carbide (SiC), there is a problem of bipolar degradation in which crystal defects extend at a time of recombination of holes injected into the n-type epitaxial layer, to increase both the forward bias voltage (Vf) of the parasitic diode and an ON-resistance (Ron) of the MOSFET.

SUMMARY

Provided is a semiconductor device capable of reducing energy loss and suppressing bipolar degradation.

A semiconductor device according to the present invention includes: a MOS transistor provided with a first semiconductor layer of a first conductivity type, a second semiconductor layer of a first conductivity type provided on a first main surface of the first semiconductor layer and having a first conductivity type impurity concentration lower than that of the first semiconductor layer, a first impurity region of a second conductivity type provided in an upper layer part of the second semiconductor layer, a second impurity region of a first conductivity type provided in an upper layer part of the first impurity region, a gate electrode provided to face at least the first impurity region and the second semiconductor layer with a gate insulating film interposed in between, a first main electrode that is at least partially connected to the second impurity region and provided to be not in direct contact with the first impurity region, and a second main electrode connected to a second main surface of the first semiconductor layer on a side opposite to a side provided with the first main electrode; a parasitic transistor configured with the second impurity region as a collector, the first semiconductor layer and the second semiconductor layer as an emitter, and the first impurity region as a base; a parasitic diode configured with the first impurity region as an anode, and the first semiconductor layer and the second semiconductor layer as a cathode; and a pn junction diode configured with the first impurity region as an anode, and the second impurity region as a cathode.

According to the semiconductor device above, when a voltage of the second main electrode is lower than a threshold value of a gate voltage for turning ON the transistor, the transistor is automatically turned ON, and a current flows through the transistor channel. Therefore, hole injection from the first impurity region to the second semiconductor layer is suppressed. This suppresses occurrence of energy loss due to a transient reverse flow of the holes when the parasitic diode returns to a reverse bias again, and enables suppression of bipolar degradation in a case of applying to SiC semiconductor devices.

These and other objects, features, aspects and advantages of the present invention will become more apparent from the following detailed description of the present invention when taken in conjunction with the accompanying drawings.

BRIEF DESCRIPTION OF THE DRAWINGS

FIG. 25 is a cross-sectional view showing a configuration of a semiconductor device of a fourth preferred embodiment according to the present invention;

FIG. 26 is an equivalent circuit diagram of the semiconductor device of the fourth preferred embodiment according to the present invention;

FIG. 39 is a cross-sectional view showing a configuration of a semiconductor device of a tenth preferred embodiment according to the present invention.

DESCRIPTION OF THE PREFERRED EMBODIMENTS

<Introduction>

Figure 1:
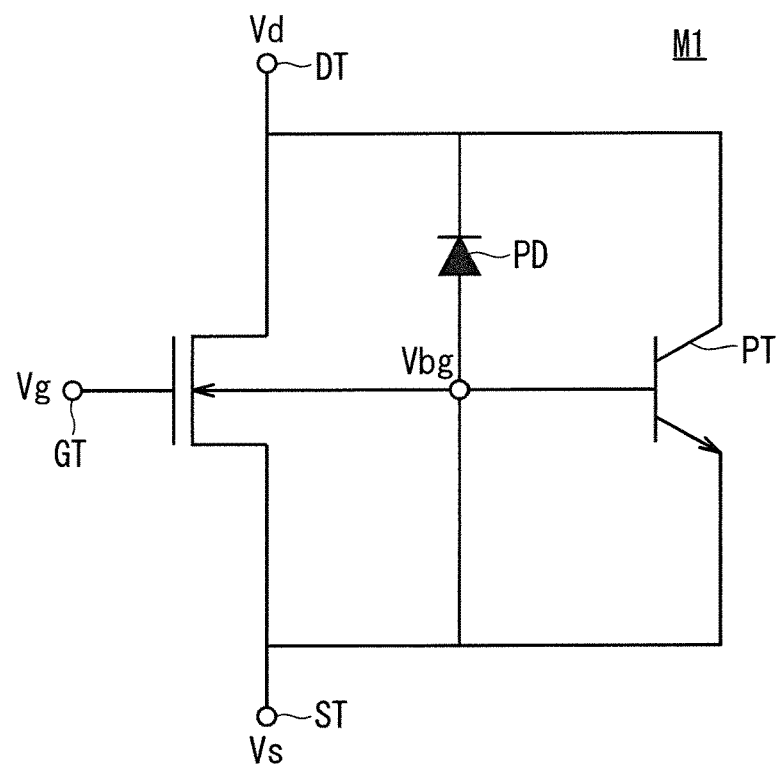
FIG. 1 is an equivalent circuit diagram of a general VDMOS.

Prior to descriptions of preferred embodiments, an operation of a VDMOS will be described with reference to FIGS. 1 to 4. FIG. 1 is an equivalent circuit diagram of a general VDMOS. As shown in FIG. 1, there is a parasitic npn transistor PT (parasitic transistor) between a drain terminal DT and a source terminal ST of a MOS transistor M1. A base electrode of the parasitic npn transistor PT is connected to a back gate of the MOS transistor M1. Further, between the back gate of the MOS transistor M1 and the drain terminal DT, there is a parasitic diode PD.

Here, voltages of the drain terminal DT, the source terminal ST, and a gate terminal GT are a drain voltage Vd, a source voltage Vs, and a gate voltage Vg, respectively, and a voltage of the back gate is a back gate voltage Vbg. Note that, in the following, a description is given with the source terminal ST used as a reference potential.

Next, a forward bias operation of a parasitic diode that occurs before and after a synchronous rectification operation for inhibiting power supply short circuit due to the synchronous rectification operation will be described with reference to FIGS. 2 to 4.

Figure 2:
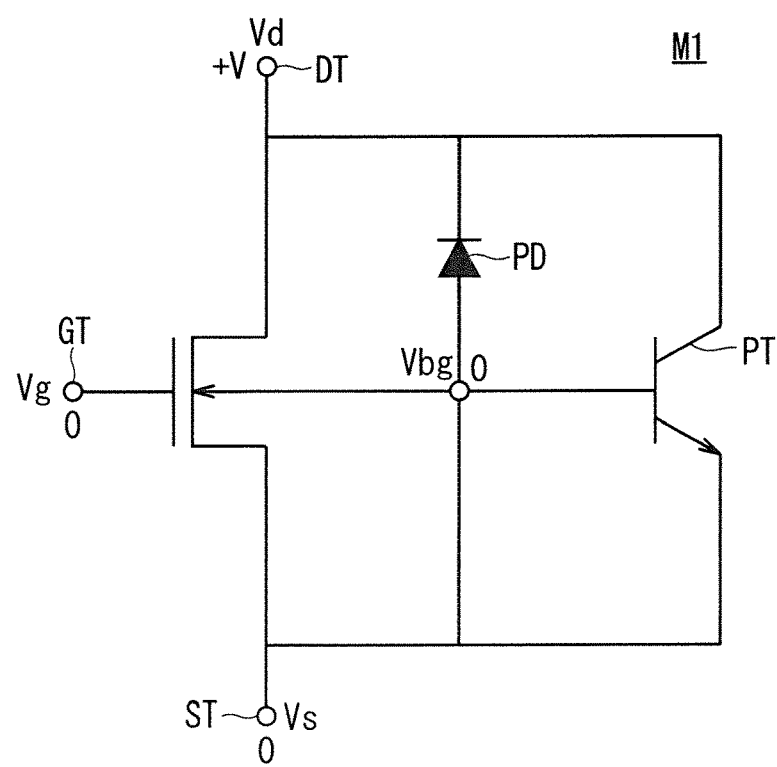
FIGS. 2 to 4 are diagrams for explaining a forward bias operation of a parasitic diode that occurs in a time before and after a synchronous rectification operation.

In FIG. 2, the gate voltage Vg and the source voltage Vs are 0 V, the drain voltage Vd is +V, and the MOS transistor M1 is in the OFF state. Here, when the drain voltage Vd changes to a negative side and causes the state of FIG. 3, the drain voltage is clamped to −Vf by a forward bias voltage Vf of the parasitic diode PD, and a current flows through the parasitic diode PD. During this period, the parasitic diode PD operates as a freewheeling diode.

Figure 4:
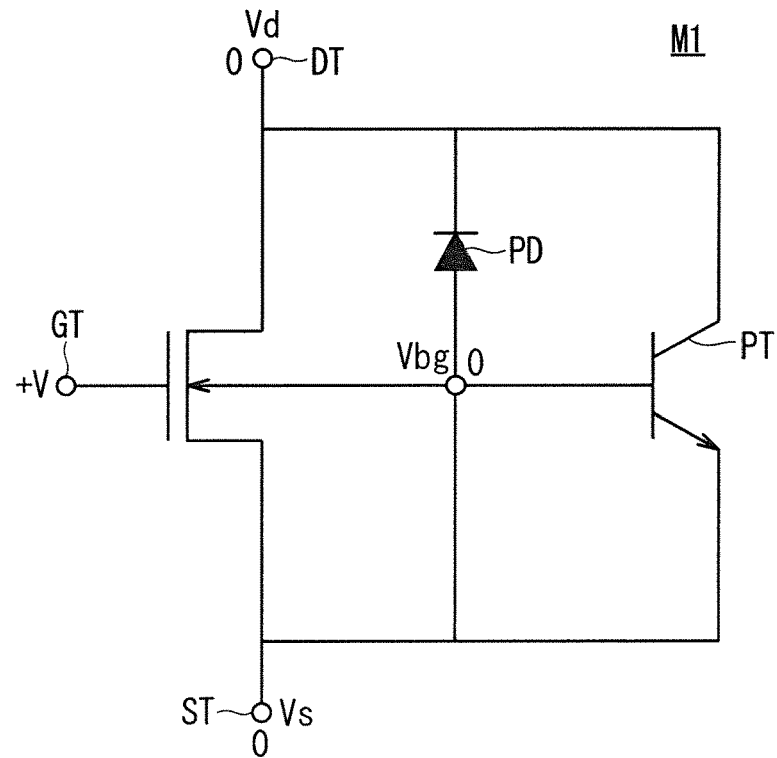

Next, as shown in FIG. 4, when a positive bias is applied to the gate terminal GT, the MOS transistor M1 is turned ON, the drain voltage Vd returns from −Vf to around 0 V when the ON-resistance of the MOS transistor M1 is sufficiently low, and a current flows through the MOS transistor M1 in a lower resistance state. This state is a state where the synchronous rectification operation is performed.

Figure 3:
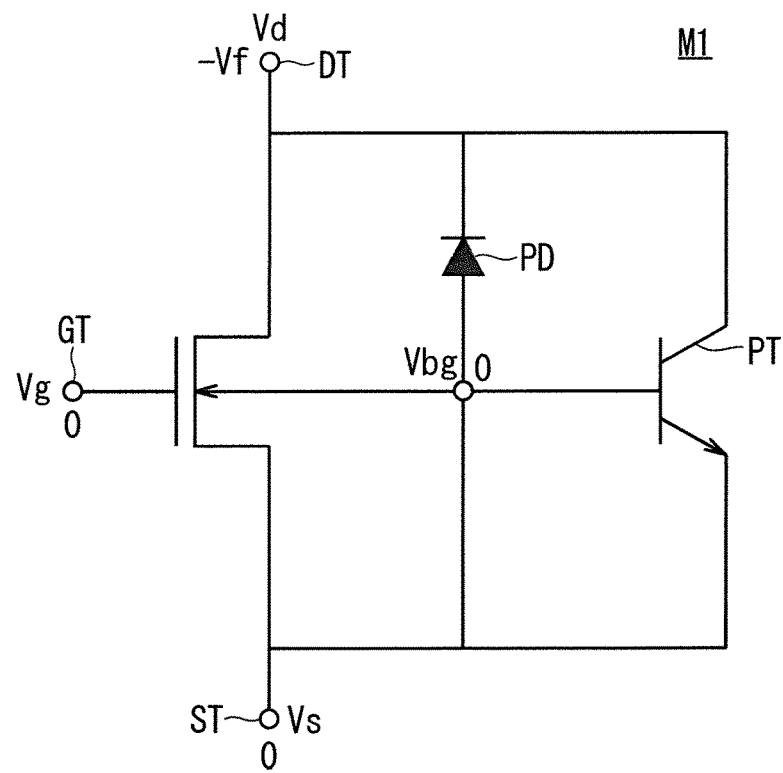

In order to change from here to the state of FIG. 2, the gate is once turned OFF to return to the state of FIG. 3, and then return to the state of FIG. 2. However, since the parasitic diode PD is forward-biased in the state of FIG. 3, holes are injected into an n-type (first conductivity type) epitaxial layer. Then, the injected holes transiently flow reversely when the state changes to the state of FIG. 2 and the parasitic diode PD returns to the reverse bias again, which causes energy loss. Further, in a case where there is a parasitic resistance between the source and the back gate, a forward bias occurs between an emitter and a base of the parasitic npn transistor PT by a current due to the reverse flow of the holes, and the parasitic npn transistor PT is turned ON.

In the state of FIG. 2, the MOS transistor M1 is originally in the OFF state. However, when a plurality of MOS transistors M1 are connected in series to form an inverter, power supply short circuit occurs when the parasitic npn transistor PT is turned ON, and a voltage higher than a breakdown voltage may be applied to the MOS transistor M1, which may lead to dielectric breakdown.

Hereinafter, a general operation when using a MOS transistor as an inverter will be described with reference to FIGS. 5 to 7, and a cause of the dielectric breakdown described above will be described.

An equivalent circuit of a conventional MOS transistor has the configuration shown in FIG. 1 and has a parasitic diode. Here, for example, as a drive circuit for a motor, as shown in FIG. 5, MOS transistors Q1 and Q2 are connected in series between a power terminal VT and a ground GND, to control input/output of a current to an output terminal OT. Note that, FIGS. 5 to 7 show parasitic diodes D1 and D2 to be used as freewheeling diodes, while omitting the parasitic npn transistor for convenience.

Figure 5:
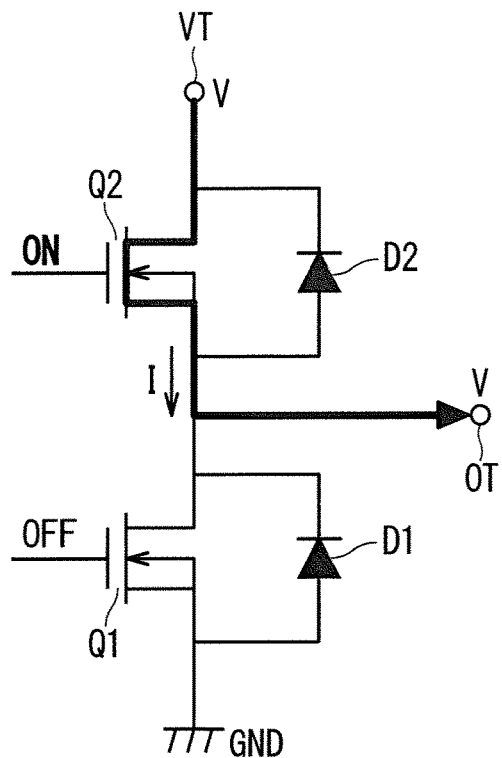
FIGS. 5 to 7 are diagrams for explaining a general operation when a semiconductor device is used as an inverter.

FIG. 5 shows a state where the high-potential side MOS transistor Q2 is ON and a current I is outputted from the output terminal OT via the MOS transistor Q2.

Since the motor is driven, a coil (not shown) is to be connected to the output terminal OT. Then, for example, at the moment when the high-potential side MOS transistor Q2 is turned OFF from the ON state, the current I is maintained by an inductance component (L component) of the coil, and as shown in FIG. 6, the parasitic diode D1 of the low-potential side MOS transistor Q1 is forward-biased to allow the current I to flow. In this case, the output terminal OT becomes a negative bias (−Vf) by the forward bias voltage Vf of the diode, and a drain voltage of the MOS transistor Q1 becomes lower than the source voltage.

Figure 7:
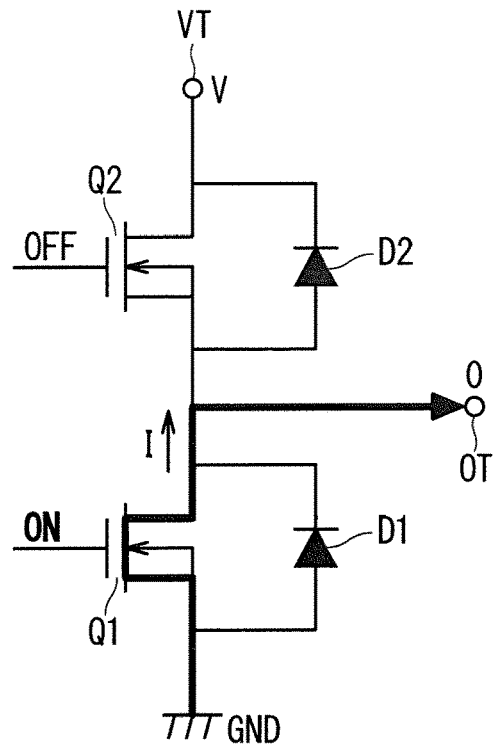

Here, when the MOS transistor Q1 is turned ON, the current I flows through the MOS transistor Q1 in a direction opposite to a normal direction as shown in FIG. 7. If the ON-resistance of the MOS transistor Q1 is small, the voltage of the output terminal OT changes from −f to around 0 V, and the loss is further lowered. This operation is the synchronous rectification operation. When the upper and lower MOS transistors Q1 and Q2 are simultaneously turned ON, a current flows from the power terminal VT to the ground GND, to cause power supply short circuit to lead to dielectric breakdown. Therefore, every time switching is performed, a state where both the upper and lower MOS transistors are OFF is required.

Figure 6:
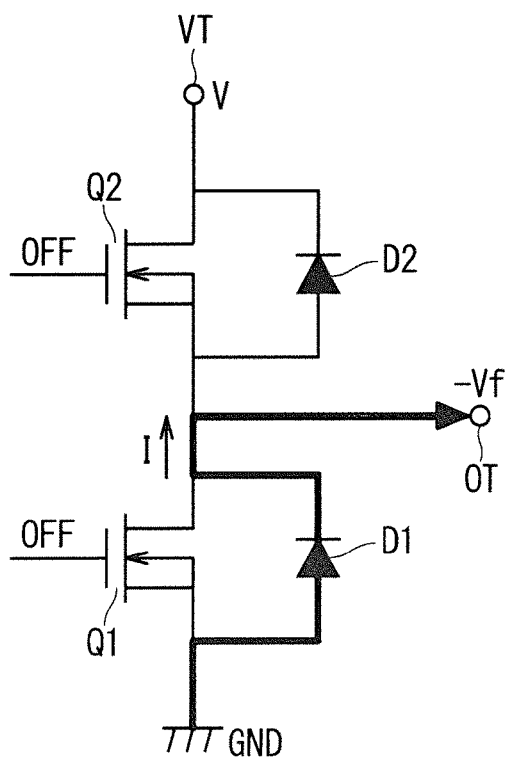

In this way, in the operation of the inverter that drives the motor, the state of FIG. 6 where the drain is lower potential than the source of the MOS transistor always exists, and a current is required to flow at that time, and the forward bias operation of the parasitic diode is typically used. However, when a parasitic diode is used as a freewheeling diode, energy loss occurs when the parasitic diode returns to a reverse bias after the parasitic diode is forward-biased. Further, in SiC semiconductor devices, there is a problem of bipolar degradation in which crystal defects extend at a time of recombination of the holes, to increase both the forward bias voltage of the parasitic diode and the ON-resistance of the MOSFET.

The inventor has recognized the problem in using a parasitic diode as a freewheeling diode, and has reached the technical idea of allowing a flow of a freewheeling current without using a parasitic diode.

First Preferred Embodiment

<Device Configuration>

Figure 8:
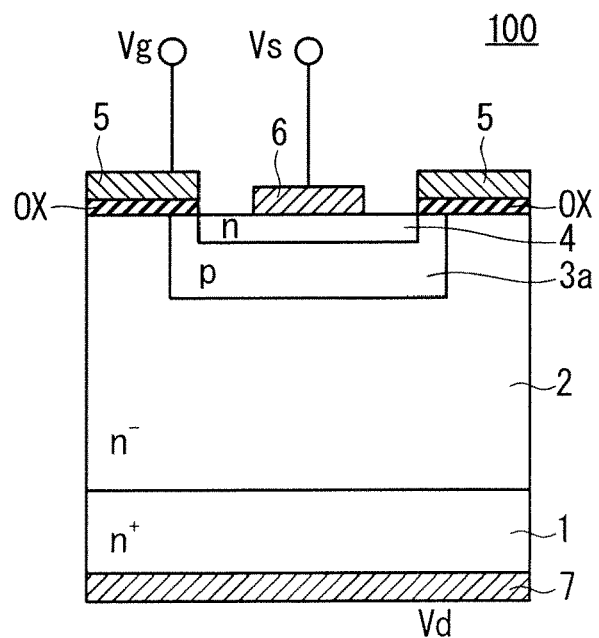
FIG. 8 is a cross-sectional view showing a configuration of a semiconductor device of a first preferred embodiment according to the present invention.

FIG. 8 is a cross-sectional view showing a configuration of a semiconductor device 100 of a first preferred embodiment according to the present invention. As shown in FIG. 8, in the semiconductor device 100, on one main surface (first main surface) of a substrate 1 (first semiconductor layer) of an n-type (first conductivity type) containing a relatively high concentration ($n^+$) of n-type impurities, an epitaxial layer 2 (second semiconductor layer) of an n-type containing a lower concentration (n) of n-type impurities than that of the substrate 1 is formed, and an impurity region 3a (first impurity region) of a p-type (second conductivity type) is formed in an upper layer part of the epitaxial layer 2. Further, an impurity region 4 (second impurity region) of an n-type is formed in an upper layer part of the impurity region 3a. In addition, a gate electrode 5 is provided so as to straddle the impurity region 3a and the epitaxial layer 2 with a gate insulating film OX interposed in between, and a source electrode 6 (first main electrode) is connected on the impurity region 4. On another main surface (second main surface) of the substrate 1 opposite to a side provided with the source electrode 6, a drain electrode 7 (second main electrode) is provided.

Figure 9:
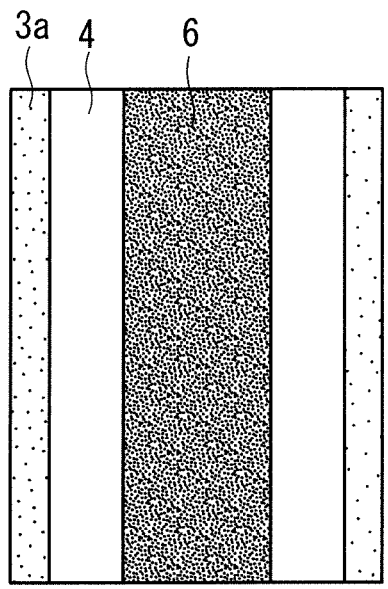
FIG. 9 is a plan view showing a configuration of the semiconductor device of the first preferred embodiment according to the present invention.

FIG. 9 is an example of a plan view when the semiconductor device 100 is viewed from the source electrode 6 side, and the gate electrode 5 is omitted for convenience. Note that FIG. 9 is a plan view in a case where the source electrode 6 and the impurity region 4 are formed in a stripe shape, but the plan view shape of the source electrode 6 and the impurity region 4 is not limited to this.

Figure 10:
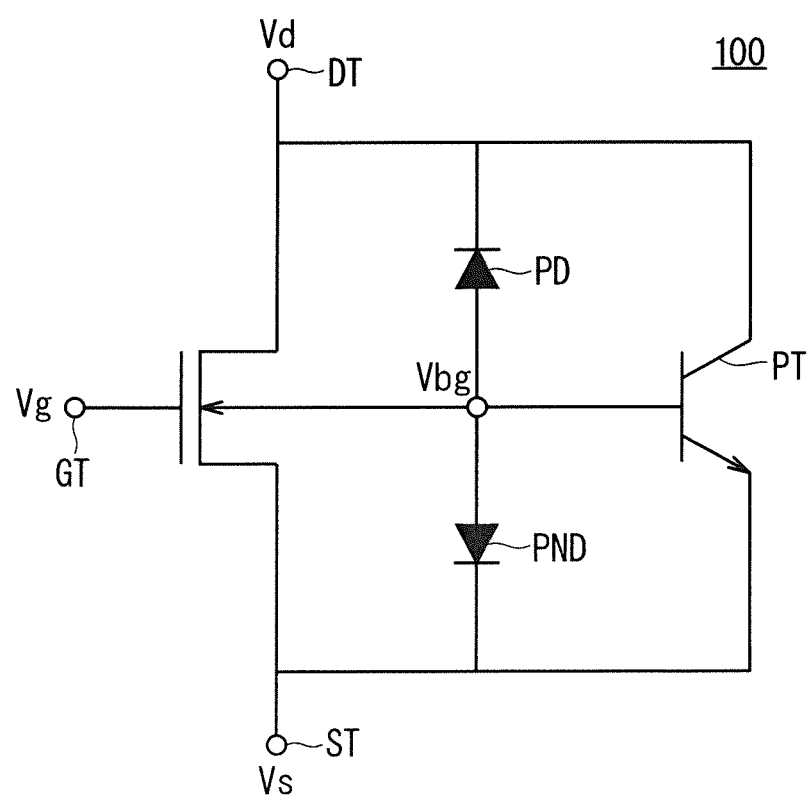
FIG. 10 is an equivalent circuit diagram of the semiconductor device of the first preferred embodiment according to the present invention.

FIG. 10 is an equivalent circuit diagram of the semiconductor device 100. As shown in FIG. 10, there is a parasitic npn transistor PT in parallel with a MOS transistor between a drain terminal DT and a source terminal ST of the semiconductor device 100. A base of the parasitic npn transistor PT is connected to a back gate of the MOS transistor. Further, there is a parasitic diode PD between the back gate of the MOS transistor and the drain terminal DT, and there is a pn junction diode PND between the back gate and the source terminal ST.

Here, voltages of the drain terminal DT, the source terminal ST, and a gate terminal GT are a drain voltage Vd, a source voltage Vs, and a gate voltage Vg, respectively, and a voltage of the back gate is a back gate voltage Vbg.

In the semiconductor device 100 of the first preferred embodiment, the source electrode 6 is made in contact exclusively with the impurity region 4, that is, a source region, and the pn junction diode PND by a pn junction between the impurity region 4 and the impurity region 3a can be obtained.

Whereas, although the parasitic npn transistor PT may operate since the base and an emitter of the parasitic npn transistor PT, that is, the impurity region 3a and the impurity region 4 are not short-circuited, the operation of the parasitic npn transistor can be suppressed since a lifetime of the impurity region 3a is shortened such that Ic/Ie is 1/1000 or less (Ic/Ie≤1/1000) in an emitter current Ie and a collector current Ic of the parasitic npn transistor.

In a case of a Si semiconductor device made of silicon (Si), an example of lifetime control includes formation of defects in a crystal by platinum diffusion, gold diffusion, electron beam irradiation, proton irradiation, helium irradiation, and the like to the impurity region 3a.

Platinum and gold themselves stay in Si, to have an energy level that allows electrons and holes to recombine efficiently. Therefore, platinum or gold is generally sputtered thinly on the Si surface and diffused into Si at 800 to 900° C.

Electrons, protons, and helium themselves do not stay in Si, but are implanted into Si with high energy to form damage (defect) in the Si crystal at a certain rate when stopping in Si. The energy level of this defect functions to cause recombination of electrons and holes.

Further, in a case of a SiC semiconductor device, a lifetime satisfying Ic/Ie≤1/1000 can be obtained by forming the impurity region 3a by implanting aluminum (Al) with a dose of $1 \times 10^{13}$ to $1 \times 10^{14}$ cm$^{-2}$, and performing activation annealing at 1600 to 1800° C.

The activation annealing is processing for electrically activating dopant introduced by ion implantation, and high-frequency induction heating, infrared lamp heating, electron impact heating, or the like is used for heating.

Note that a short lifetime region in the impurity region 3a may be partially formed in the impurity region 3a or may be formed in the entire impurity region 3a.

<Operation>

Next, an operation of the semiconductor device 100 will be described with reference to FIGS. 11 to 13. Note that, in FIGS. 11 to 13, the parasitic npn transistor is omitted for convenience.

Figure 11:
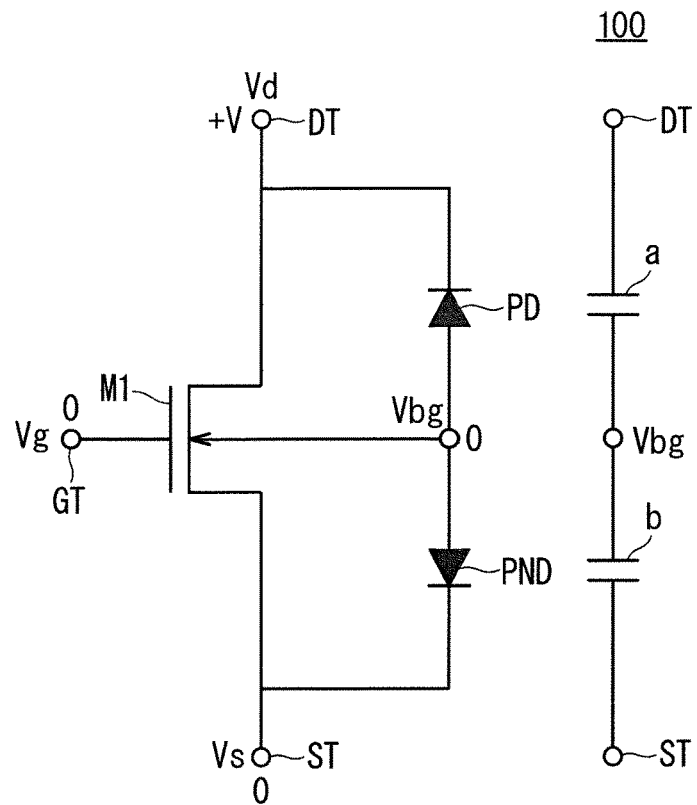
FIGS. 11 to 13 are diagrams for explaining an operation of the semiconductor device of the first preferred embodiment according to the present invention.

In FIG. 11, the gate voltage Vg and the source voltage Vs are 0 V, the drain voltage Vd is +V, and the MOS transistor in the semiconductor device 100 is in the OFF state. Here, there is a junction capacitance a between the back gate and the drain terminal DT, there is a junction capacitance b between the back gate and the source terminal ST, and the junction capacitance a and the junction capacitance b are connected in series between the drain terminal DT and the source terminal ST. FIG. 11 additionally shows series connection of the junction capacitance a and the junction capacitance b.

Figure 12:
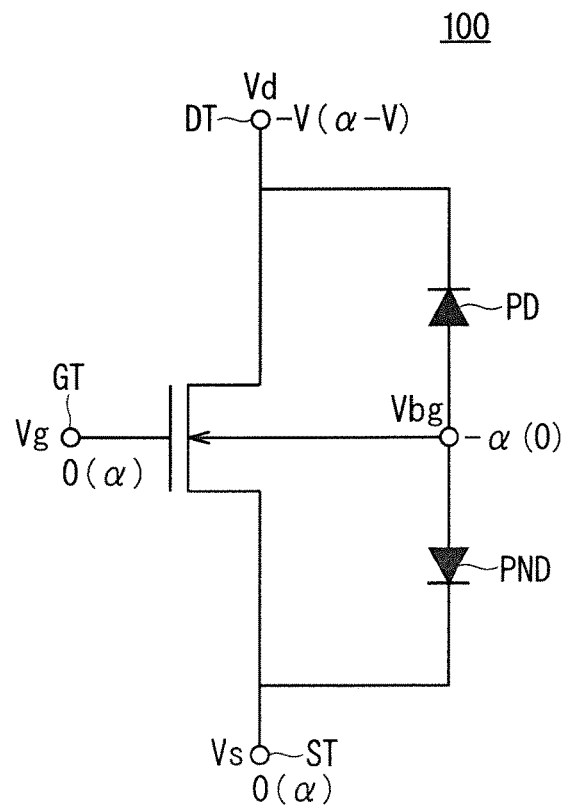
Figure 13:
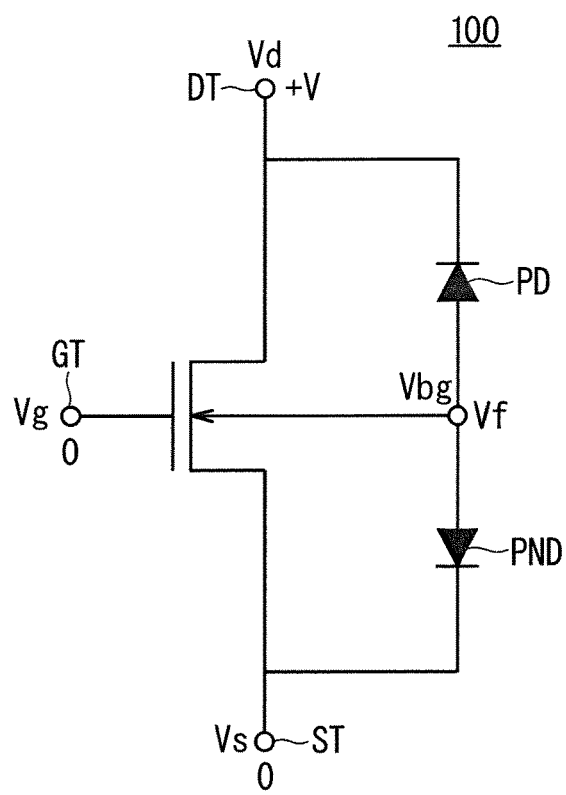

Here, in a case where the drain voltage Vd changes to the negative side and the drain voltage Vd changes in a direction of applying a forward bias to the parasitic diode PD, a voltage of each part changes from as shown in FIG. 11 to FIG. 12, and the drain voltage Vd decreases from FIG. 11 to FIG. 12. However, here, the junction capacitance a and the junction capacitance b are connected in series and charges accumulated in the junction capacitance a move to the junction capacitance b as a potential difference of the junction capacitance a decreases. Therefore, the back gate voltage Vbg also decreases.

FIG. 12 shows a state where the gate voltage Vg and the source voltage Vs are 0 V, the drain voltage Vd is −V, and the back gate voltage Vbg is −α. Until the junction capacitance a changes to a forward bias, a relationship of the following Equation (1) is established.

$$\alpha \geq V \qquad (1)$$

In FIG. 12, a relative potential of the drain terminal DT is α−V, a relative potential of the back gate is 0 V, and a relative potential of the gate terminal GT and the source terminal ST is α.

From the relative potential of each part, when a coefficient of a back gate bias effect is β (0<β≤1) and a threshold value of the gate voltage for turning ON the MOS transistor is Vth, the MOS transistor is turned ON when the following Equation (2) is satisfied, and a current flows from the source terminal ST toward the drain terminal DT in a direction opposite to a normal direction.

$$\alpha \geq Vth + \beta(\alpha - V) \qquad (2)$$

Therefore, a condition of a voltage V for turning ON the MOS transistor can be expressed by the following Equation (3).

$$V \geq \{Vth - \alpha(1-\beta)\}/\beta \qquad (3)$$

Here, the condition is more severe as the second term on the right side of Equation (3) is smaller. Therefore, when a is replaced with V using Equation (1), it can be expressed by Equation (4) below.

$$V \geq Vth \qquad (4)$$

Consequently, from Equation (1), α can be expressed by Equation (5) below.

$$\alpha \geq Vth \qquad (5)$$

As described above, when the drain voltage Vd becomes lower than −Vth, the MOS transistor is automatically turned ON, and a current flows through a channel of the semiconductor device 100. Therefore, hole injection from the impurity region 3a to the epitaxial layer 2 is suppressed as compared with a case where the parasitic diode PD is forward-biased to cause a current flow.

For improving a junction breakdown voltage of the pn junction diode PND, it is conceivable to lower the concentration of the impurity region 3a and form the impurity region 3a deeper such that a depletion layer extending toward inside the impurity region 3a does not reach the impurity region 4 from the pn junction between the impurity region 3a and the epitaxial layer 2 in a breakdown voltage holding state, or to configure the semiconductor device 100 with a wide band gap semiconductor such as SiC.

Note that, when a voltage is applied such that the drain voltage Vd becomes a positive bias from the state of FIG. 12, an operation is caused in which the junction capacitance a is charged with the junction capacitance b of the pn junction diode PND. Then, as shown in FIG. 13, the back gate voltage Vbg increases up to the forward bias voltage Vf of the parasitic diode PD, and the threshold value Vth decreases as a reverse back gate bias effect.

As described above, in the semiconductor device 100 of the first preferred embodiment, by setting the junction breakdown voltage of the pn junction diode PND to Vth or higher, the MOS transistor is automatically turned ON when the drain voltage Vd becomes lower than −Vth, and a current flows through the channel of the semiconductor device 100. Therefore, hole injection from the impurity region 3a into the epitaxial layer 2 is suppressed. This suppresses occurrence of energy loss due to a transient reverse flow of the holes when the MOS transistor changes to the state of FIG. 11 and the parasitic diode PD returns to a reverse bias again. Further, even in a case where there is a parasitic resistance between the source and the back gate, a forward bias is not generated between the emitter and the base of the parasitic npn transistor PT, and the parasitic npn transistor PT is not to be turned ON. This suppresses the parasitic npn transistor PT from being turned ON, and an occurrence of power supply short circuit can be avoided, in a case where the semiconductor device 100 configures an inverter.

Second Preferred Embodiment

Figure 14:
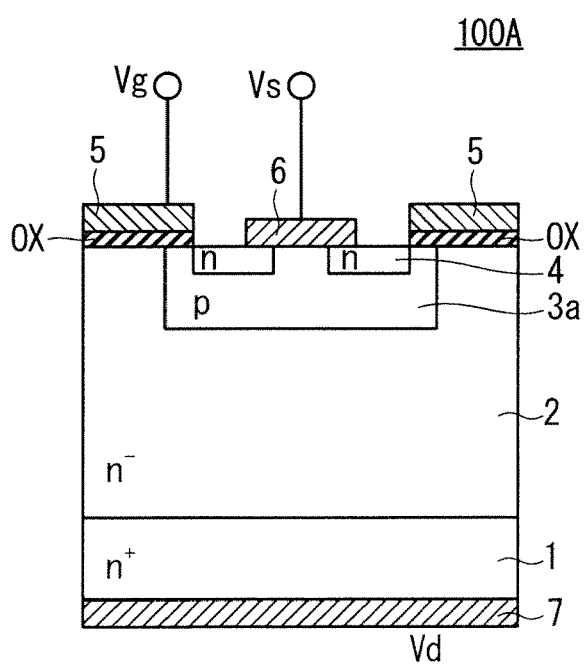
FIG. 14 is a cross-sectional view showing a configuration of a semiconductor device of a second preferred embodiment according to the present invention.

FIG. 14 is a cross-sectional view showing a configuration of a semiconductor device 100A of a second preferred embodiment according to the present invention. As shown in FIG. 14, in the semiconductor device 100A, there is a region where an impurity region 4 is partially not provided in a lower part of a source electrode 6. In that region, there is an impurity region 3a, and the source electrode 6 is in direct contact with the impurity region 3a. Note that, in FIG. 14, the same components as those of the semiconductor device 100 described with reference to FIG. 8 are denoted by the same reference numerals, and redundant description is omitted.

Figure 15:
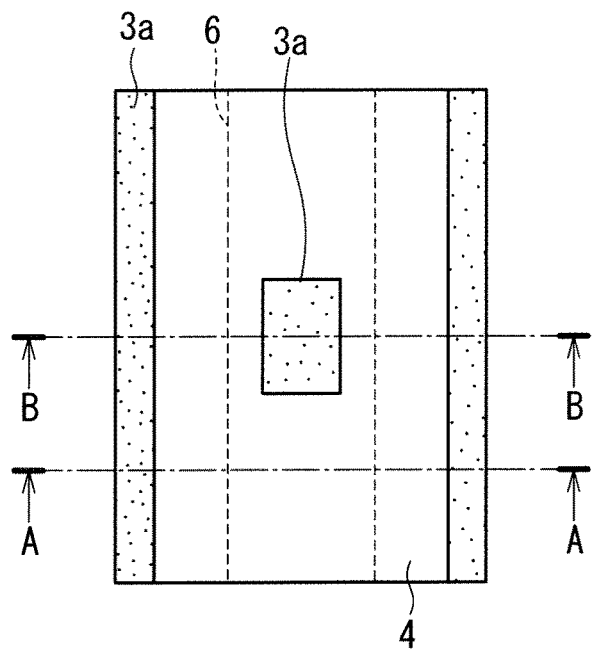
FIG. 15 is a plan view showing a configuration of the semiconductor device of the second preferred embodiment according to the present invention.

FIG. 15 is an example of a plan view when the semiconductor device 100A is viewed from the source electrode 6 side, in which a gate electrode 5 and the source electrode 6 are omitted for convenience, and an outline of the source electrode 6 is indicated by a broken line. The arrow cross-sectional view taken along line A-A in FIG. 15 corresponds to FIG. 8, and the arrow cross-sectional view taken along the B-B corresponds to FIG. 14.

In the semiconductor device 100 of the first preferred embodiment, as shown in FIG. 11, it has been described that the back gate voltage Vbg decreases since the junction capacitance a and the junction capacitance b are connected in series, the drain voltage Vd decreases, and charges accumulated in the junction capacitance a move to the junction capacitance b as the potential difference of the junction capacitance a decreases.

However, if the potential of the impurity region 3*a*, that is, the back gate voltage Vbg becomes too low with respect to the impurity region 4, the effective threshold value Vth increases due to the back gate bias effect, and there is a possibility of deterioration of the gate insulating film OX and dielectric breakdown when a gate voltage Vg equal to or higher than a standard upper limit value is applied to turn ON the MOS transistor in this state.

On the contrary, an increase of the potential of the impurity region 3*a* causes a forward bias voltage for the pn junction diode PND, which increases the current of the MOS transistor. This forward bias voltage is limited by being clamped by the forward bias voltage Vf of the pn junction diode PND, but the effective threshold value Vth is lowered by a reverse back gate bias effect. Thus, if the back gate voltage Vbg becomes too high, the current in the ON state increases more than necessary, an allowable time at a time of power supply short circuit decreases, and there is a possibility that an unstable operation of the MOS transistor is caused due to a current change caused by fluctuation of the back gate voltage Vbg.

Accordingly, in the semiconductor device 100A of the second preferred embodiment, a configuration is adopted in which a resistor is added instead of the pn junction diode PND, in order to suppress the fluctuation of the back gate voltage Vbg described above.

Figure 16:
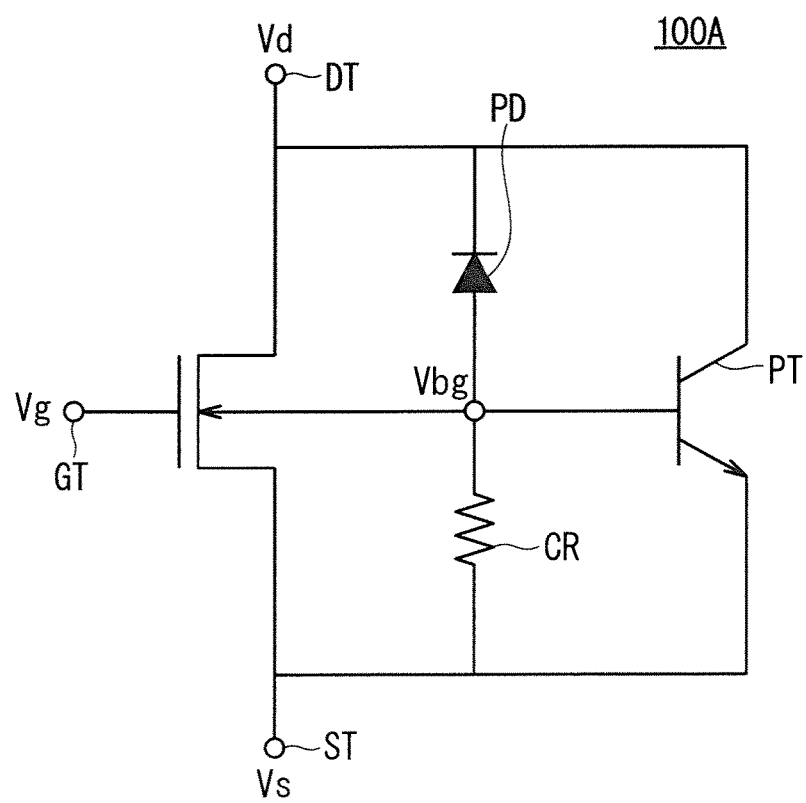
FIG. 16 is an equivalent circuit diagram of the semiconductor device of the second preferred embodiment according to the present invention.

FIG. 16 is an equivalent circuit diagram of the semiconductor device 100A. As shown in FIG. 16, a contact resistor CR is added instead of the pn junction diode PND between a back gate of a MOS transistor and a source terminal ST. That is, as shown in FIG. 14, there is formed a region where the impurity region 4 is partially not provided in the lower part of the source electrode 6. In this region, there is provided a connecting part in which the source electrode 6 is in direct contact with the impurity region 3*a*. As a result, a contact resistor between the source electrode 6 and the impurity region 3*a* is added in the connecting part instead of the pn junction diode PND.

By adopting such a configuration, it is possible to suppress excessive decrease and excessive increase of a back gate voltage Vbg, avoid deterioration of a gate insulating film OX and dielectric breakdown, and suppress an unstable operation of the MOS transistor and decrease in an allowable time at a time of power supply short circuit due to a current change caused by fluctuation of the back gate voltage Vbg.

Note that, in FIG. 15, there is partially provided the region where the impurity region 4 is not provided in a case where the source electrode 6 and the impurity region 4 are formed in a stripe shape. However, the plan view shape of the source electrode 6 and the impurity region 4 is not limited to this. For example, as shown in FIG. 17, a square pattern cell structure may be adopted in which the source electrode 6 and the impurity region 4 have a quadrangular plan view shape, or a configuration may be adopted in which cells partially not provided with the impurity region 4 and other cells are arranged, in a configuration in which a plurality of square pattern cells are combined as shown in FIG. 18.

Figure 19:
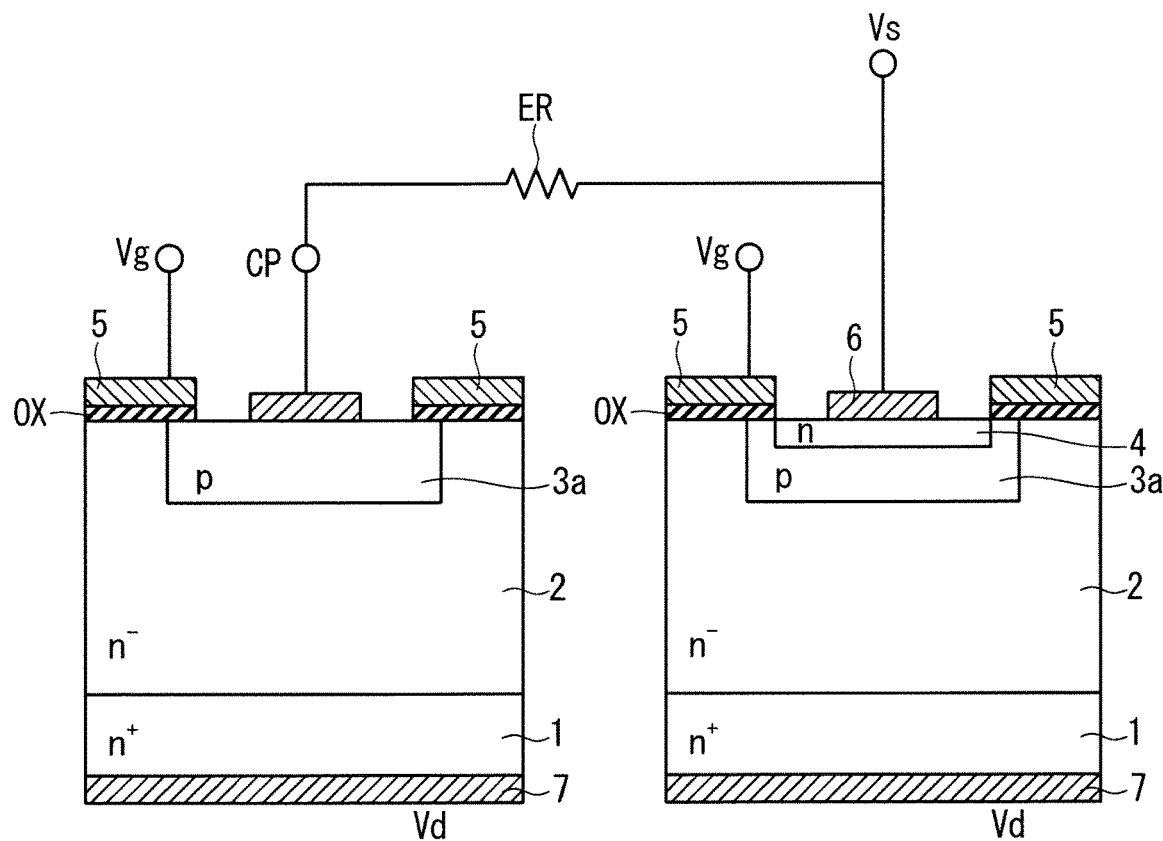
FIG. 19 is a view showing a configuration in which an external resistor is added in the semiconductor device of the second preferred embodiment according to the present invention.

Further, as shown in FIG. 19, a configuration may be adopted in which a pad CP in direct contact with the impurity region 3*a* as a back gate is provided on a part of a substrate 1, and an external resistor ER is interposed between the source electrode 6 provided on the impurity region 4 and the pad CP. As the external resistor ER, for example, polysilicon whose impurity concentration is adjusted to obtain a predetermined resistance value can be used.

Figure 17:
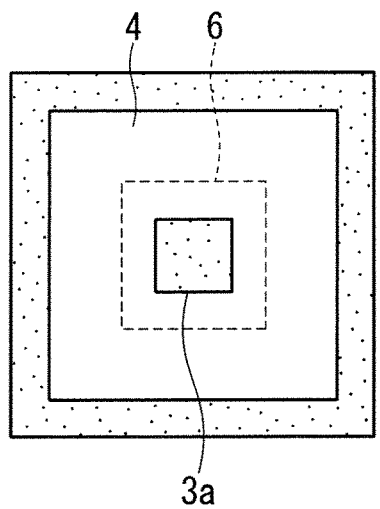
FIGS. 17 and 18 are plan views showing a configuration of the semiconductor device of the second preferred embodiment according to the present invention.
Figure 18:
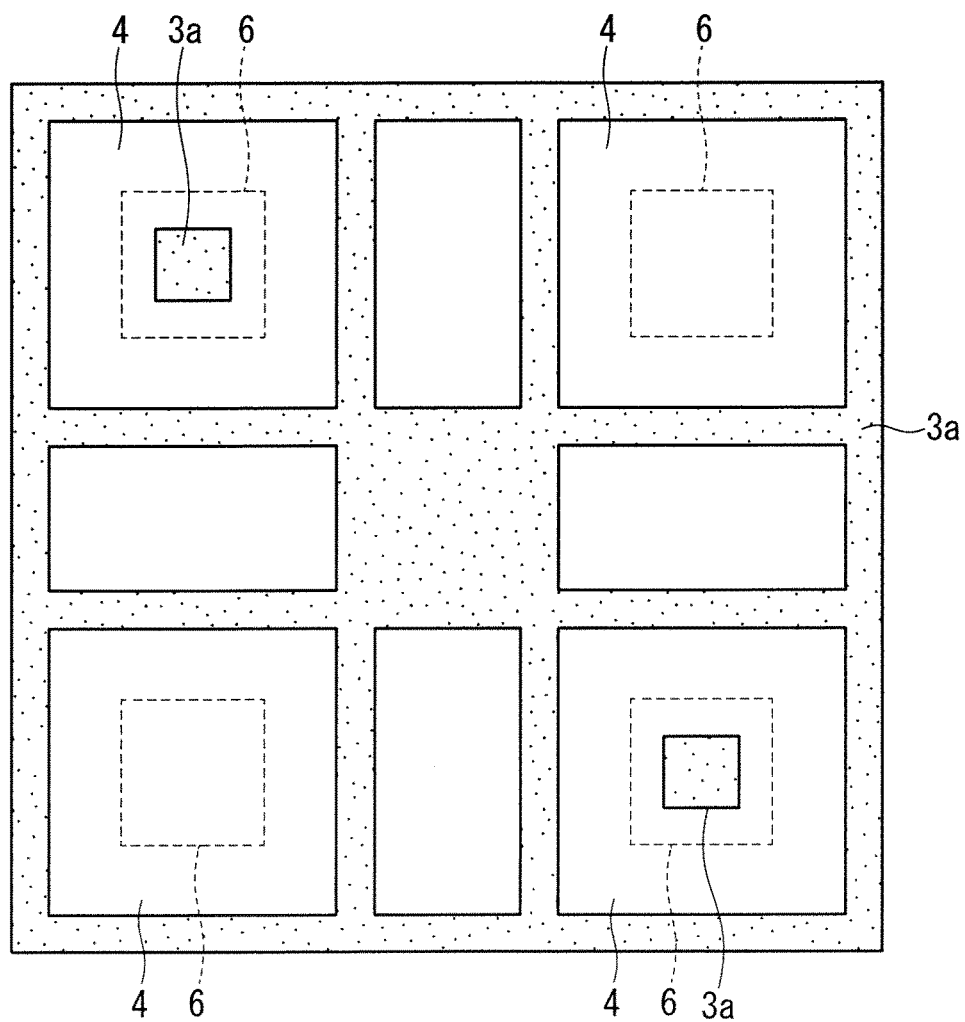

Note that, in FIGS. 15, 17 and 18, it has been described that there is the impurity region 3*a* in the region where the impurity region 4 is not provided. However, a p-type impurity region having higher impurity concentration may be provided on a surface of the impurity region 3*a*, to improve ohmic contact resistance between the source electrode 6 and the pad CP.

Third Preferred Embodiment

Figure 20:
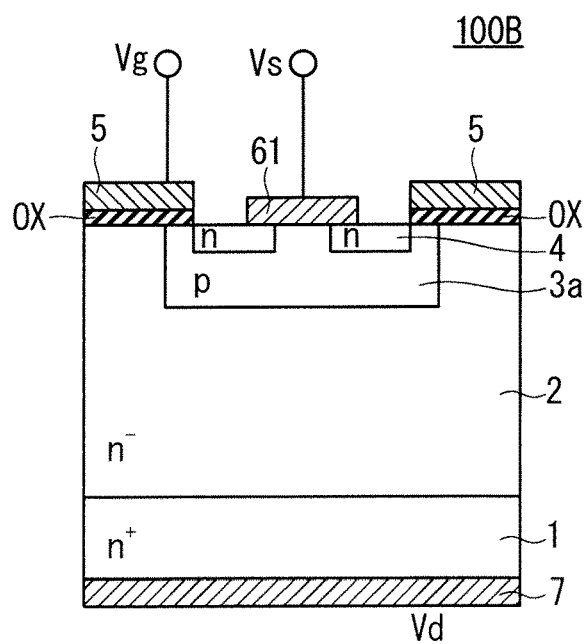
FIG. 20 is a cross-sectional view showing a configuration of a semiconductor device of a third preferred embodiment according to the present invention.

FIG. 20 is a cross-sectional view showing a configuration of a semiconductor device 100B of a third preferred embodiment according to the present invention. As shown in FIG. 20, the semiconductor device 100B has a configuration in which a source electrode 61 is configured by a Schottky electrode that forms a Schottky junction between with an impurity region 3*a*, and the source electrode 61 is in direct contact with the impurity region 3*a*.

Figure 21:
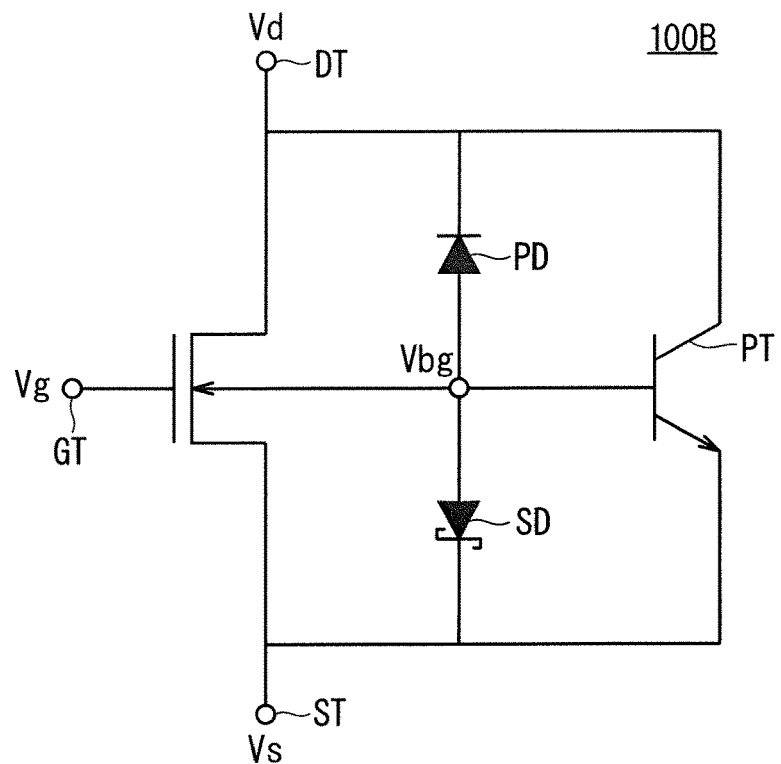
FIG. 21 is an equivalent circuit diagram of the semiconductor device of the third preferred embodiment according to the present invention.

FIG. 21 is an equivalent circuit diagram of the semiconductor device 100B. As shown in FIG. 21, a Schottky diode SD is formed between a back gate of a MOS transistor and a source terminal ST. In this case, the impurity region 3*a* is a p-type semiconductor region and thus serves as an anode, and the source electrode 61 serves as a cathode.

Since a forward bias voltage Vf of the Schottky diode is lower than a forward bias voltage Vf of a pn junction diode, an increase of a back gate voltage Vbg can be clamped by the forward bias voltage Vf of the Schottky diode SD. Note that the forward bias voltage Vf of the Schottky diode is about one half to two thirds of the forward bias voltage Vf of the pn junction diode.

This can suppress an increase in the back gate voltage Vbg, and suppress an unstable operation of the MOS transistor and decrease in an allowable time at a time of power supply short circuit due to a current change caused by fluctuation of the back gate voltage Vbg.

Note that, when a drain voltage Vd becomes lower than −Vth, the MOS transistor is automatically turned ON, and a current flows through a channel of the semiconductor device 100B. Therefore, hole injection from the impurity region 3*a* to an epitaxial layer 2 is suppressed as compared with a case where a parasitic diode PD is forward-biased to cause a current flow.

Further, a lifetime of the impurity region 3*a* is shortened such that Ic/Ie is $1/1000$ or less (Ic/Ie≤$1/1000$) in an emitter current Ie and a collector current Ic of a parasitic npn transistor, to suppress an operation of the parasitic npn transistor. Note that, as the source electrode 61, it is possible to use any electrode material used in manufacture of semiconductor devices, such as Al—Si, Al—Si—Cu (copper), Al—Cu, and W (tungsten) as long as a silicide of titanium (Ti) is formed on a surface of the impurity region 3*a*. Note that the source electrode 6 of the first and second preferred embodiments can also be formed of Al—Si, Al—Si—Cu, Al—Cu, and W.

Figure 22:
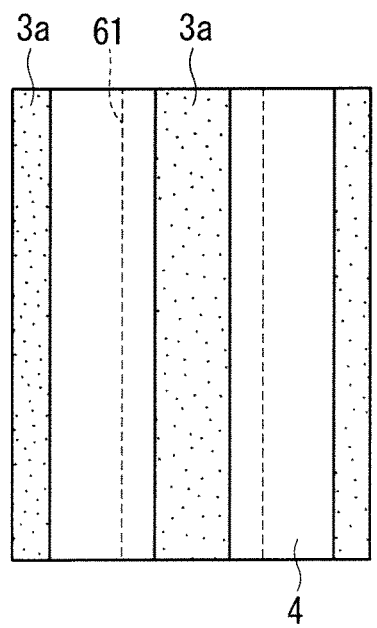
FIGS. 22 to 24 are plan views showing a configuration of the semiconductor device of the third preferred embodiment according to the present invention.

FIG. 22 is an example of a plan view when the semiconductor device 100B is viewed from the source electrode 61 side, in which a gate electrode 5 and the source electrode 61 are omitted for convenience, and an outline of the source electrode 61 is indicated by a broken line. As shown in FIG. 22, the source electrode 61 and an impurity region 4 are formed in a stripe shape, and the source electrode 61 is in direct contact with the stripe-shaped impurity region 3*a* in a portion where the impurity region 4 is not provided.

Figure 23:
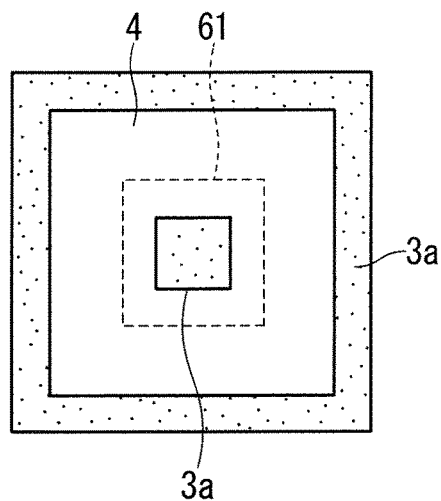
Figure 24:
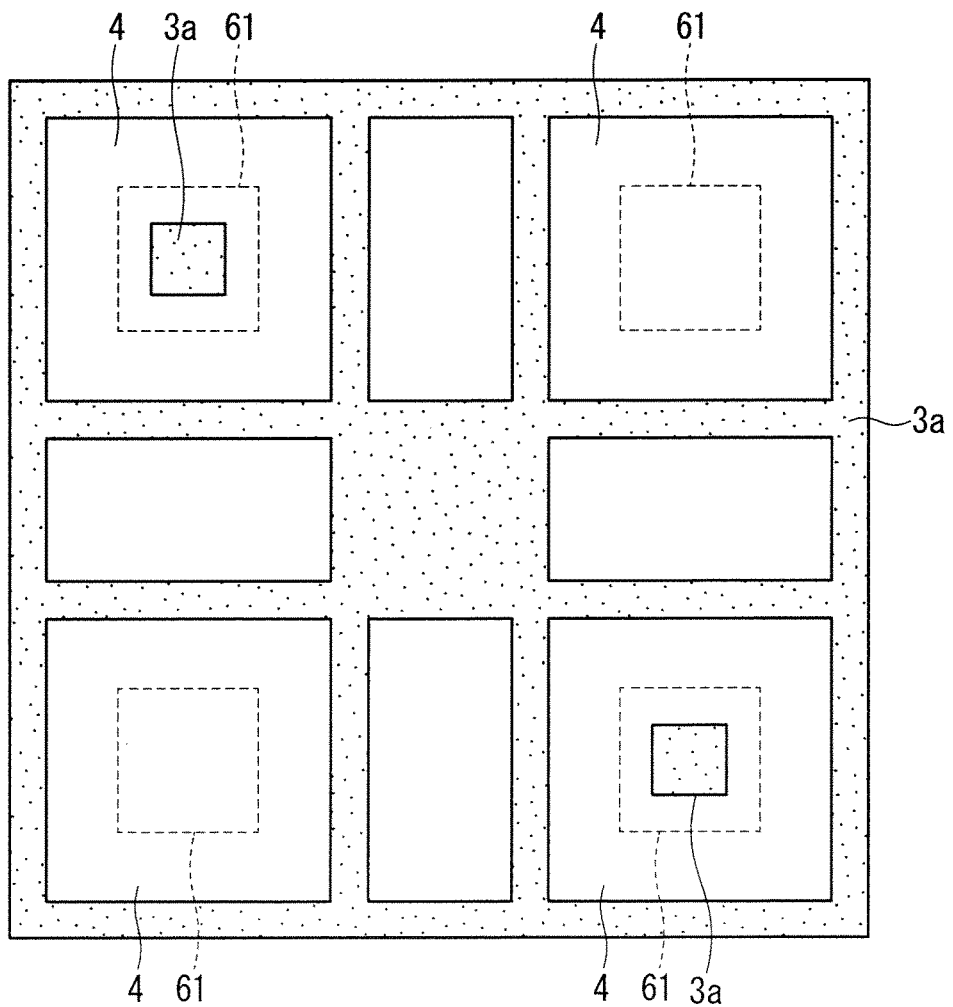

Note that the plan view shape of the source electrode 61, the impurity region 4, and the impurity region 3a is not limited to this. For example, as shown in FIG. 23, a square pattern cell structure may be adopted in which the source electrode 61, the impurity region 4, and the impurity region 3a have a quadrangular plan view shape, or a configuration may be adopted in which cells partially not provided with the impurity region 4 and other cells are arranged, in a configuration in which a plurality of square pattern cells are combined as shown in FIG. 24.

Further, there is also a method of providing an external Schottky diode instead of the external resistor ER shown in FIG. 19. In this case, a pad in direct contact with the impurity region 3a as a back gate may be provided on a part of a substrate 1, and a Schottky diode may be interposed between the pad and the source electrode.

Fourth Preferred Embodiment

FIG. 25 is a cross-sectional view showing a configuration of a semiconductor device 100C of a fourth preferred embodiment according to the present invention. As shown in FIG. 25, in the semiconductor device 100C, there is a region where an impurity region 4 is partially not provided in a lower part of a source electrode 6. In that region, there is an impurity region 3a, and there is provided a narrow band gap layer 9 made of a material having a narrower band gap than that of the impurity region 3a and including an n-type impurity, on the impurity region 3a. Meanwhile, an impurity concentration of the n-type impurities in the narrow band gap layer 9 is desirably higher than that in the impurity region 4. Then, the source electrode 6 is provided in contact with the narrow band gap layer 9 and in contact with the impurity region 4. Note that the source electrode 6 may not be in contact with the impurity region 4 as long as the narrow band gap layer 9 is provided in contact with the impurity region 4.

FIG. 26 is an equivalent circuit diagram of the semiconductor device 100C. As shown in FIG. 26, a low forward bias diode LD is formed between a back gate of a MOS transistor and a source terminal ST. The low forward bias diode LD is a pn junction diode in which the impurity region 3a serves as an anode and the narrow band gap layer 9 serves as a cathode.

Here, in a case where the semiconductor device 100C is a SiC semiconductor device using the substrate 1 as a SiC substrate, the narrow band gap layer 9 can be formed of a Si layer. In this case, a forward bias voltage Vf of the low forward bias diode LD is about 0.6 V, which is a forward bias voltage of the pn junction in the Si semiconductor device. In addition, since the forward bias voltage of the pn junction in the SiC semiconductor device is about 2.7 V, it is possible to suppress an increase in a back gate voltage Vbg, and suppress an unstable operation of the MOS transistor and decrease in an allowable time at a time of power supply short circuit due to a current change caused by fluctuation of the back gate voltage Vbg.

Note that, when the drain voltage Vd becomes lower than −Vth, the MOS transistor is automatically turned ON, and a current flows through a channel of the semiconductor device 100C. Therefore, hole injection from the impurity region 3a to an epitaxial layer 2 is suppressed as compared with a case where a parasitic diode PD is forward-biased to cause a current flow.

Further, a lifetime of the impurity region 3a is shortened such that Ic/Ie is 1/1000 or less (Ic/Ie≤1/1000) in an emitter current Ie and a collector current Ic of a parasitic npn transistor, to suppress an operation of the parasitic npn transistor.

Meanwhile, as a plan view shape when the semiconductor device 100C is viewed from the source electrode 6 side, for example, a configuration similar to the plan view shape of the semiconductor device 100A shown in FIG. 15 may be adopted. Further, in a case where the source electrode 6 and the impurity region 4 are formed in a stripe shape, a configuration may be adopted in which there is partially provided a region in which the impurity region 4 is not provided, and the narrow band gap layer 9 is provided on the impurity region 3a of that region.

The planar view shape of the source electrode 6 and the impurity region 4 is not limited to this. For example, similarly to the plan view shape of the semiconductor device 100A as shown in FIG. 17, a square pattern cell structure may be adopted in which the source electrode 6 and the impurity region 4 have a quadrangular plan view shape, or a configuration may be adopted in which cells partially not provided with the impurity region 4 and other cells are arranged, in a configuration in which a plurality of square pattern cells are combined as shown in FIG. 18.

Further, there is also a method of providing an external low forward bias diode instead of the external resistor ER shown in FIG. 19. In this case, configuration may be adopted in which a pad in direct contact with the impurity region 3a as a back gate is provided on a part of the substrate 1, and a pn junction diode of Si is interposed as a low forward bias diode between the pad and the source electrode.

Figure 27:
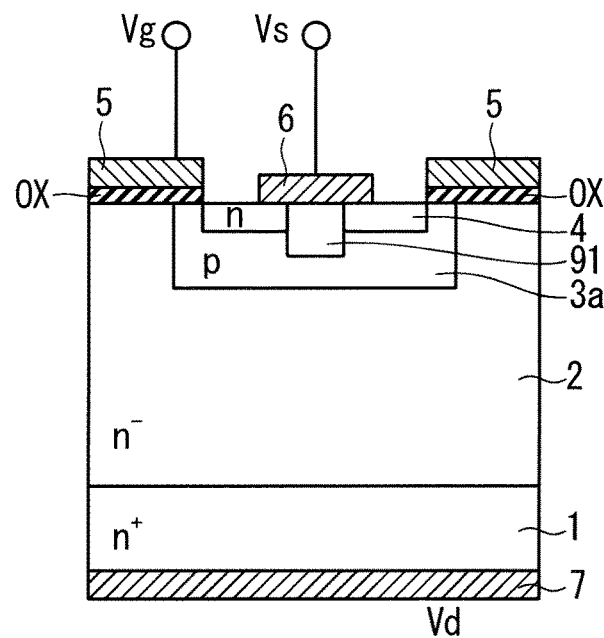
FIG. 27 is a cross-sectional view showing another configuration of the semiconductor device of the fourth preferred embodiment according to the present invention.

Here, in a case where the semiconductor device 100C is a Si semiconductor device having the substrate 1 as a Si substrate, as shown in FIG. 27, it is possible to provide a narrow band gap region 91 implanted with a group IV element, instead of providing the narrow band gap layer 9. By the group IV element being implanted into the Si semiconductor layer, a lattice spacing in the implanted region in the Si semiconductor layer is widened, and a semiconductor having a narrower band gap than the Si semiconductor layer is formed. Meanwhile, as the group IV element, for example, germanium (Ge) can be used. The narrow band gap region 91 is formed to a depth passing through the impurity region 4 in a thickness direction to reach inside the impurity region 3a.

In this case, the pn junction diode having the impurity region 3a as an anode and the impurity region 4 as a cathode becomes a low forward bias diode due to the presence of the narrow band gap region 91, and becomes same as FIG. 26 in terms of the equivalent circuit.

Fifth Preferred Embodiment

Figure 28:
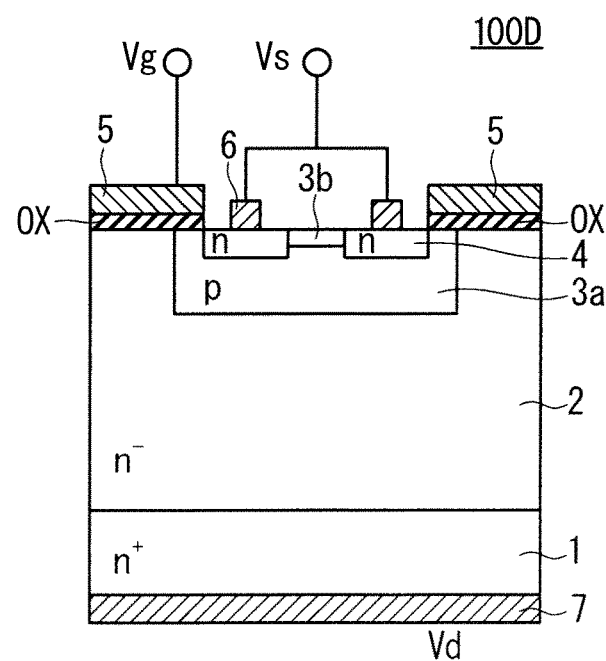
FIG. 28 is a cross-sectional view showing a configuration of a semiconductor device of a fifth preferred embodiment according to the present invention.

FIG. 28 is a cross-sectional view showing a configuration of a semiconductor device 100D of a fifth preferred embodiment according to the present invention. As shown in FIG. 28, in the semiconductor device 100D, in an impurity region 3a, an impurity region 3b (third impurity region) containing p-type impurities is provided so as to be sandwiched between impurity regions 4, and a voltage clamping diode of low breakdown voltage is formed using a pn junction between the impurity region 3b and the impurity region 4. Note that an impurity concentration of the impurity region 3b is higher than that of the impurity region 3a. Moreover, an impurity concentration of the p-type impurities in the impurity region 3b is desirably higher than that of the impurity region 3a.

In addition, in the example of FIG. 28, a plan view shape of the impurity region 3b and the impurity region 4 is a stripe shape, and a source electrode 6 is provided so as to be individually connected to the impurity regions 4 on both sides of the impurity region 3b.

Figure 29:
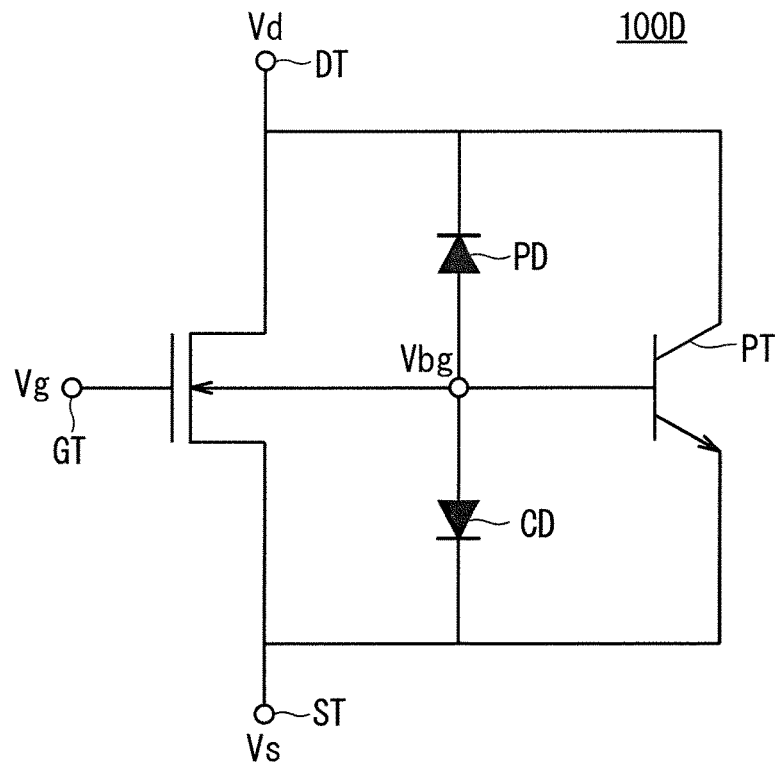
FIG. 29 is an equivalent circuit diagram of the semiconductor device of the fifth preferred embodiment according to the present invention.

FIG. 29 is an equivalent circuit diagram of the semiconductor device 100D. As shown in FIG. 29, a voltage clamping diode CD is formed between a back gate of a MOS transistor and a source terminal ST. The voltage clamping diode CD is a pn junction diode in which the impurity region 3b serves as an anode and the impurity region 4 serves as a cathode.

The voltage clamping diode CD has a function similar to that of the pn junction diode PND of the semiconductor device 100 of the first preferred embodiment. In the semiconductor device 100, when the drain voltage Vd changes in a direction of applying a forward bias to the parasitic diode PD, the back gate voltage Vbg decreases, and the decrease stops at the pn junction breakdown voltage of the pn junction diode PND. However, if this pn junction breakdown voltage is too high, an effective threshold value Vth increases, and a gate voltage Vg that is equal to or higher than a standard upper limit value is required to turn ON the MOS transistor in this state.

If the effective threshold value Vth becomes too high, a gate voltage Vg equal to or higher than the standard upper limit value is to be applied to turn ON the MOS transistor in this state, which may cause deterioration of the gate insulating film OX and dielectric breakdown due to excessive decrease of the back gate voltage Vbg.

Whereas, in the semiconductor device 100D, by providing a voltage clamping diode CD of low breakdown voltage instead of the pn junction diode PND, a decrease in a back gate voltage Vbg stops at a pn junction breakdown voltage of a voltage clamping diode CD, and an effective threshold value Vth can be suppressed from becoming unnecessarily high.

Note that, when the drain voltage Vd becomes lower than −Vth, a MOS transistor is automatically turned ON, and a current flows through a channel of the semiconductor device 100D. Therefore, hole injection from the impurity region 3a to an epitaxial layer 2 is suppressed as compared with a case where a parasitic diode PD is forward-biased to cause a current flow.

Further, a lifetime of the impurity region 3a is shortened such that Ic/Ie is 1/1000 or less (Id/Ie≤1/1000) in an emitter current Ie and a collector current Ic of a parasitic npn transistor, to suppress an operation of the parasitic npn transistor.

Note that a clamping voltage of the voltage clamping diode CD, that is, the pn junction breakdown voltage, is at least a threshold value Vth of the MOS transistor or more and a maximum gate voltage or less. For example, when a gate drive voltage of the MOS transistor is 15 V, a maximum gate voltage, which is a maximum voltage that can be applied to a gate electrode 5, is often 24 V. In this case, 24 V or less is set, and a specific value is set in consideration of balance between stability of the back gate voltage Vbg and an ON operation of the MOS transistor.

The pn junction breakdown voltage of the voltage clamping diode CD decreases as the impurity concentration of the impurity region 3b and the impurity region 4 increases. For example, in a case where the semiconductor device 100D is a Si semiconductor device, the pn junction breakdown voltage is calculated to be about 11 V when the impurity concentration of the impurity region 3b is $1\times10^{17}$ cm$^{-3}$, and the pn junction breakdown voltage is calculated to be about 3 V when the impurity concentration of the impurity region 3b is $1\times10^{18}$ cm$^{-}$.

Note that, in the semiconductor device 100D, a pn junction diode is also formed between the impurity region 3a and the impurity region 4. However, since the back gate voltage Vbg is determined by the lower pn junction breakdown voltage, the presence of the pn junction diode between the impurity region 3a and the impurity region 4 is ignored, and is not shown in FIG. 29.

Figure 30:
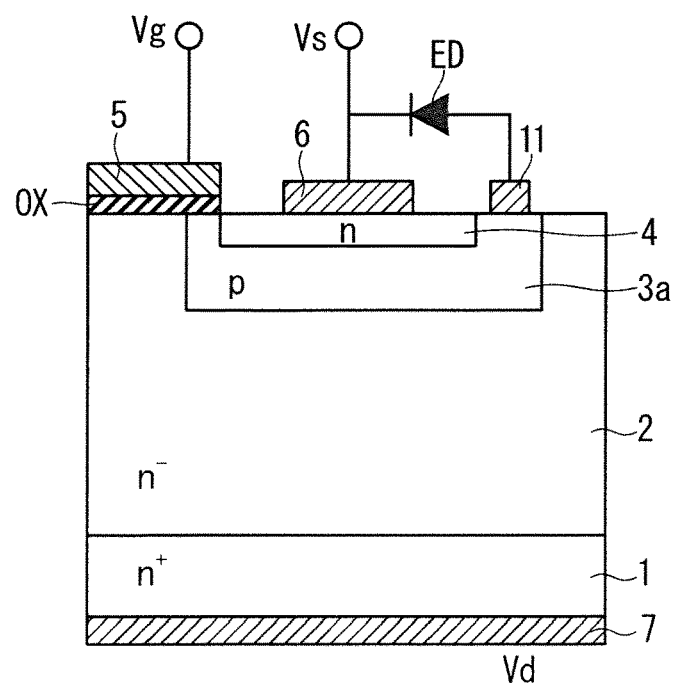
FIG. 30 is a view showing a configuration in which an external voltage clamping diode is added in the semiconductor device of the fifth preferred embodiment according to the present invention.

In FIG. 28, the voltage clamping diode CD is provided using the pn junction between the impurity region 3b and the impurity region 4. However, a configuration may be adopted in which, as shown in FIG. 30, an electrode 11 in contact with the impurity region 3a is provided, and an external voltage clamping diode ED is interposed between the source electrode 6 and the electrode 11.

Further, there is also a method of providing an external voltage clamping diode instead of the external resistor ER shown in FIG. 19. In this case, a pad in direct contact with the impurity region 3a as a back gate may be provided on a part of the substrate 1, and a voltage clamping diode may be interposed between the pad and the source electrode.

Sixth Preferred Embodiment

Figure 31:
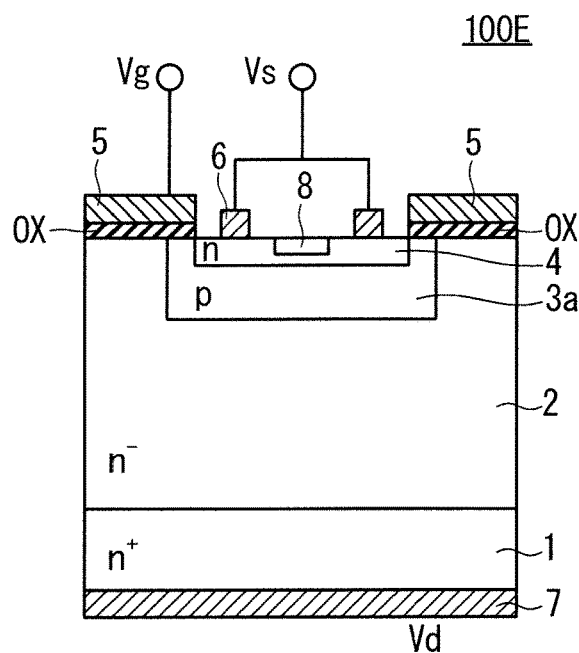
FIG. 31 is a cross-sectional view showing a configuration of a semiconductor device of a sixth preferred embodiment according to the present invention.

FIG. 31 is a cross-sectional view showing a configuration of a semiconductor device 100E of a sixth preferred embodiment according to the present invention. As shown in FIG. 31, in the semiconductor device 100E, in an impurity region 3a, an impurity region 8 (third impurity region) containing p-type impurities is provided so as to be surrounded by an impurity region 4, and a junction capacitance of a pn junction diode formed by a pn junction between the impurity region 3a and the impurity region 4 is increased. Although illustration is omitted, the impurity region 4 under the impurity region 8 is partially removed to provide a portion where the impurity region 8 is in contact with the impurity region 3a.

In the semiconductor device 100D of the fifth preferred embodiment, the P$^+$ impurity region 3b is provided so as to be sandwiched between the impurity regions 4, to form the voltage clamping diode of low breakdown voltage. However, in the semiconductor device 100E, the impurity region 8 is formed so as to be surrounded by the impurity region 4. This increases a pn junction area of a pn junction diode (first pn junction diode) between the impurity region 4 and the impurity region 8 and a pn junction area of a pn junction diode (second pn junction diode) between the impurity region 4 and the impurity region 3a, and a pn junction diode having a large junction capacitance can be obtained.

Figure 32:
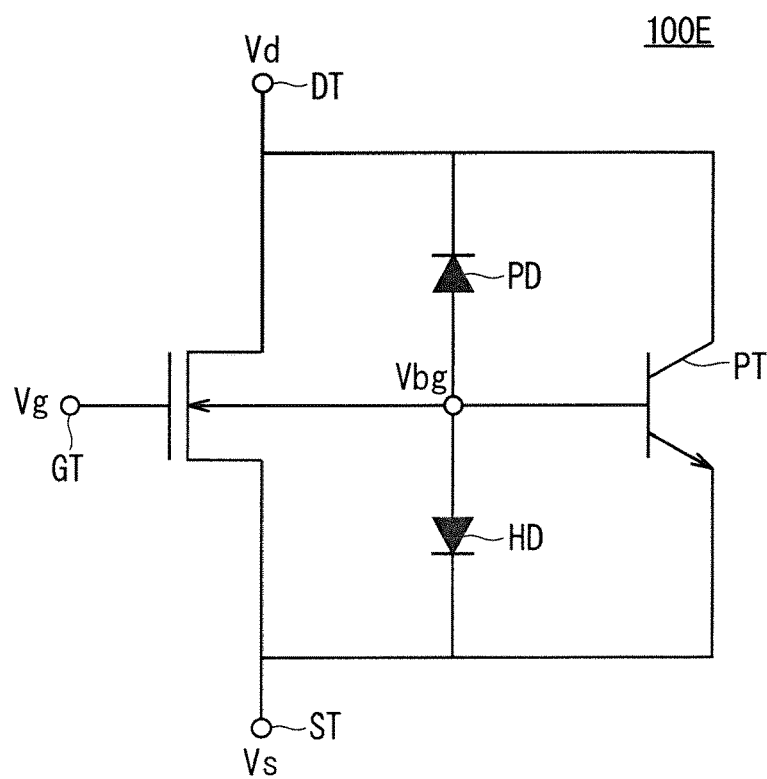
FIG. 32 is an equivalent circuit diagram of the semiconductor device of the sixth preferred embodiment according to the present invention.

FIG. 32 is an equivalent circuit diagram of the semiconductor device 100E. As shown in FIG. 32, between a back gate of the semiconductor device 100E and a source terminal ST, a pn junction diode HD having a large junction capacitance is formed. The pn junction diode HD includes the first pn junction diode and the second pn junction diode described above. In the pn junction diode HD, the impurity region 8 serves as an anode and the impurity region 4 serves as a cathode.

The semiconductor device 100E is similar to the semiconductor device 100 of the first preferred embodiment in that a diode is formed at this position. However, in the semiconductor device 100, the back gate voltage Vbg decreases when the drain voltage Vd changes in a direction of applying a forward bias to the parasitic diode PD, but the decrease stops at a pn junction breakdown voltage of the pn junction diode PND. However, if this pn junction breakdown voltage is too high, an effective threshold value Vth increases, and a gate voltage Vg that is equal to or higher than a standard upper limit value is required to turn ON the MOS transistor in this state.

On the contrary, when the drain voltage Vd changes in a direction of applying a forward bias to the pn junction diode PND, a current of the MOS transistor increases. This forward bias voltage is limited by being clamped by the forward bias voltage Vf of the pn junction diode PND, but the effective threshold value Vth is lowered by a reverse back gate bias effect. Thus, if the back gate voltage Vbg becomes too high, the current in the ON state increases more than necessary, and an allowable time at a time of power supply short circuit decreases. Further, there is a possibility that an unstable operation of the MOS transistor is caused due to a current change caused by fluctuation of the back gate voltage Vbg.

Further, if the effective threshold value Vth becomes too high, a gate voltage Vg equal to or higher than the standard upper limit value is to be applied to turn ON the MOS transistor in this state, which may cause deterioration of the gate insulating film OX and dielectric breakdown due to excessive decrease of the back gate voltage Vbg.

Whereas, in the semiconductor device 100E, by increasing a junction capacitance of the pn junction diode HD, it is possible to suppress excessive decrease and excessive increase of a back gate voltage Vbg, avoid deterioration of a gate insulating film OX and dielectric breakdown, and suppress an unstable operation of a MOS transistor and decrease in an allowable time at a time of power supply short circuit due to a current change caused by fluctuation of the back gate voltage Vbg.

Note that, when a drain voltage Vd becomes lower than −Vth, the MOS transistor is automatically turned ON, and a current flows through a channel of the semiconductor device 100E. Therefore, hole injection from the impurity region 3a to an epitaxial layer 2 is suppressed as compared with a case where a parasitic diode PD is forward-biased to cause a current flow.

Further, a lifetime of the impurity region 3a is shortened such that Ic/Ie is $\frac{1}{1000}$ or less (Ic/Ie≤$\frac{1}{1000}$) in an emitter current Ie and a collector current Ic of a parasitic npn transistor, to suppress an operation of the parasitic npn transistor.

Increasing the junction capacitance of the pn junction diode increases a charge Q accumulated in the junction capacitance. When the junction capacitance is C and a voltage of the junction capacitance between electrodes is V, it is expressed by Q=CV and the current is dQ/dt. Therefore, when the junction capacitance increases, a change in the voltage V is to be suppressed.

Note that, in the semiconductor device 100D of the fifth preferred embodiment, the P+ impurity region 3b is provided so as to be sandwiched between the impurity regions 4 to form the voltage clamping diode of low breakdown voltage. However, the semiconductor device 100D is similar to the semiconductor device 100E in that a junction capacitance of the pn junction diode is increased since a plurality of pn junction diodes are to be connected in parallel between the impurity region 3a and the impurity region 4 even in a case of providing a voltage clamping diode.

Figure 33:
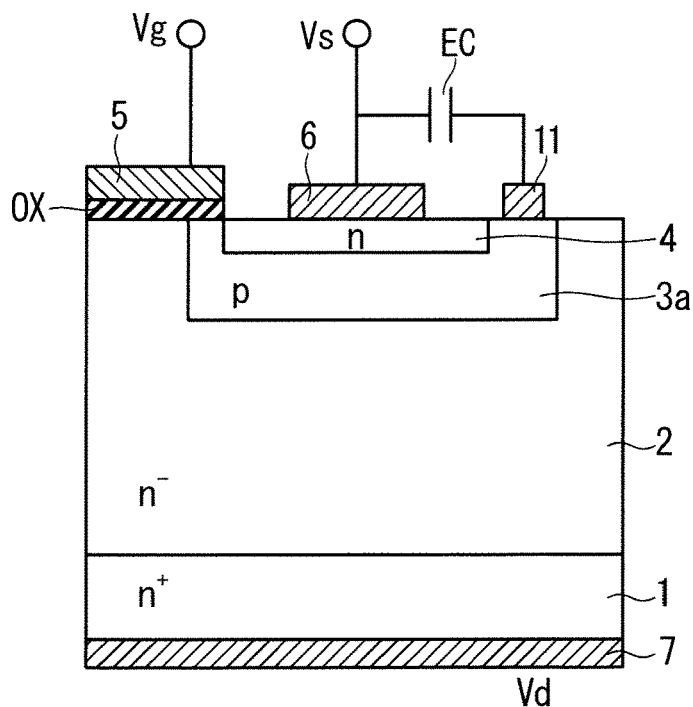
FIG. 33 is a view showing a configuration in which an external diode is added in the semiconductor device of the sixth preferred embodiment according to the present invention.

In FIG. 31, in order to increase the junction capacitance of the pn junction diode, the impurity region 8 is provided and the pn junction between the impurity region 8 and the impurity region 4 is used. However, a configuration may be adopted in which, as shown in FIG. 33, an electrode 11 in contact with the impurity region 3a is provided, and an external capacitor EC is interposed between the source electrode 6 and the electrode 11.

Seventh Preferred Embodiment

Figure 34:
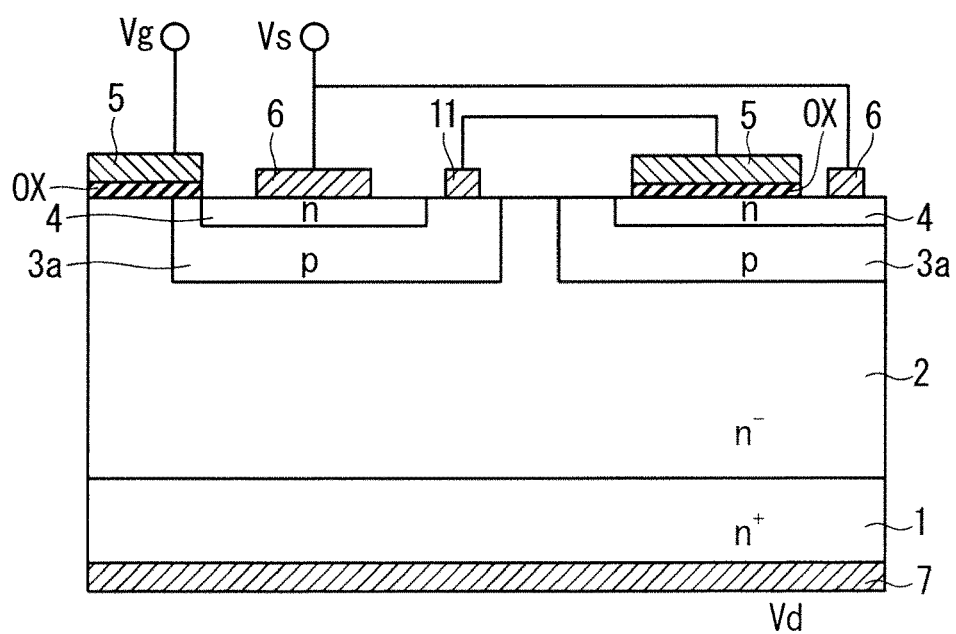
FIG. 34 is a cross-sectional view showing a configuration of a semiconductor device of a seventh preferred embodiment according to the present invention.

FIG. 34 is a cross-sectional view showing a configuration of a semiconductor device 100F of a seventh preferred embodiment according to the present invention. As shown in FIG. 34, the semiconductor device 100F has a configuration in which a MOS capacitor is added in the semiconductor device 100 of the first preferred embodiment shown in FIG. 8.

That is, an impurity region 3a is provided in an upper layer part of an epitaxial layer 2 separately from an impurity region 3a, and an impurity region 4 is provided in an upper layer part thereof. In this impurity region 4, a gate electrode 5 is provided with a gate insulating film OX interposed in between, to form a MOS transistor structure. This gate electrode 5 is connected to an electrode 11 provided so as to be in contact with the impurity region 3a, which is a back gate of the MOS transistor. Further, a source electrode 6 is formed on the impurity region 4 forming the MOS transistor structure, this source electrode 6 is short-circuited with a source electrode 6 of the MOS transistor, and a MOS capacitor is added to the MOS transistor of the semiconductor device 100 shown in the first preferred embodiment.

Figure 35:
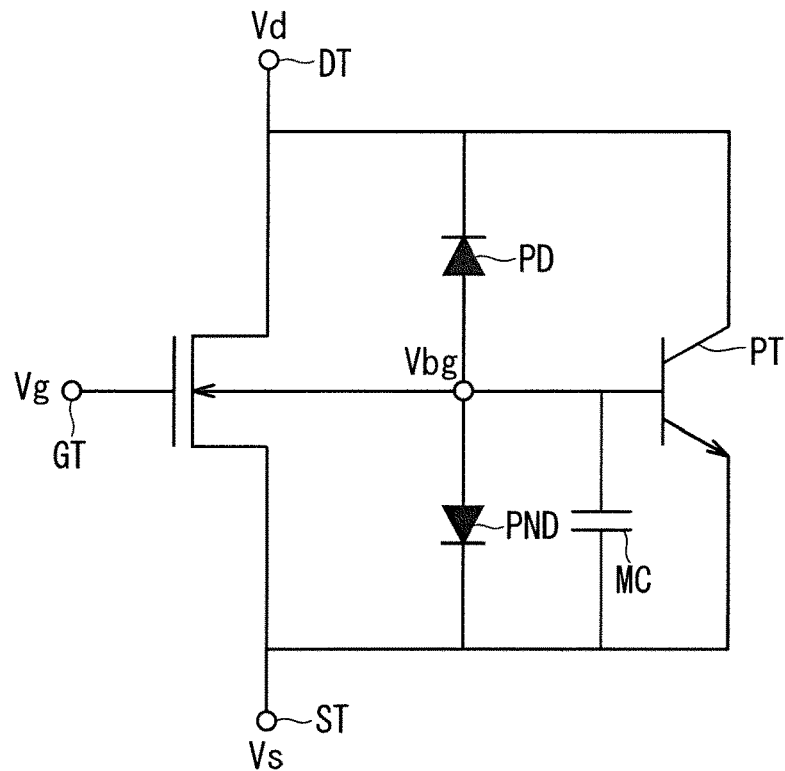
FIG. 35 is an equivalent circuit diagram of the semiconductor device of the seventh preferred embodiment according to the present invention.

FIG. 35 is an equivalent circuit diagram of the semiconductor device 100F. As shown in FIG. 35, between a back gate of the semiconductor device 100F and a source terminal ST, a pn junction diode PND is formed, and a MOS capacitor MC is connected in parallel with the pn junction diode PND.

In the semiconductor device 100 of the first preferred embodiment, the back gate voltage Vbg decreases when the drain voltage Vd changes in a direction of applying a forward bias to the parasitic diode PD, but the decrease stops at a pn junction breakdown voltage of the pn junction diode PND. However, if this pn junction breakdown voltage is too high, an effective threshold value Vth increases, and a gate voltage Vg that is equal to or higher than a standard upper limit value is required to turn ON the MOS transistor in this state.

On the contrary, when the drain voltage Vd changes in a direction of applying a forward bias to the pn junction diode PND, a current of the MOS transistor increases. This forward bias voltage is limited by being clamped by the forward bias voltage Vf of the pn junction diode PND, but the effective threshold value Vth is lowered by a reverse back gate bias effect. Thus, if the back gate voltage Vbg becomes too high, the current in the ON state increases more than necessary, and an allowable time at a time of power supply short circuit decreases. Further, there is a possibility that an unstable operation of the MOS transistor is caused due to a current change caused by fluctuation of the back gate voltage Vbg.

Further, if the effective threshold value Vth becomes too high, a gate voltage Vg equal to or higher than the standard upper limit value is to be applied to turn ON the MOS transistor in this state, which may cause deterioration of the gate insulating film OX and dielectric breakdown due to excessive decrease of the back gate voltage Vbg.

Whereas, in the semiconductor device 100E, by the added MOS capacitor MC, it is possible to suppress excessive decrease and excessive increase of a back gate voltage Vbg, avoid deterioration of the gate insulating film OX and dielectric breakdown, and suppress an unstable operation of the MOS transistor and decrease in an allowable time at a time of power supply short circuit due to a current change caused by fluctuation of the back gate voltage Vbg. The reason is the same as the reason that the fluctuation of the back gate voltage Vbg can be suppressed by increasing the junction capacitance of the pn junction diode in the sixth preferred embodiment.

Further, in FIG. 34, the MOS capacitor is added by forming the MOS transistor structure. However, as shown in FIG. 33, an external capacitor EC may be interposed.

Eighth Preferred Embodiment

Figure 36:
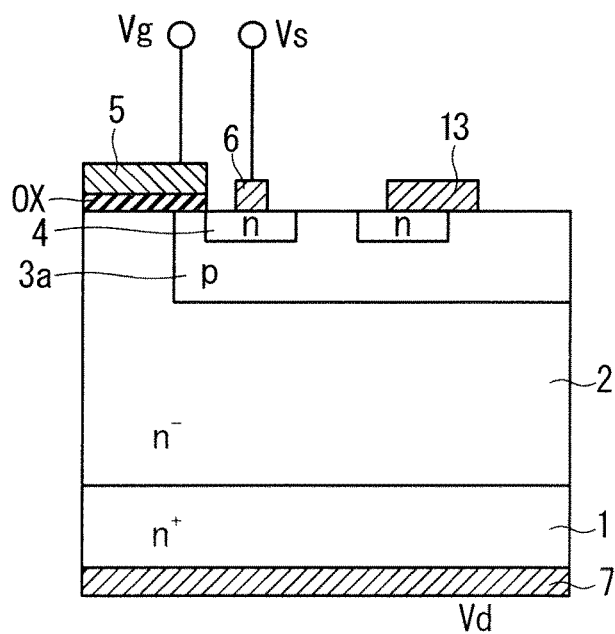
FIG. 36 is a cross-sectional view showing a configuration of a semiconductor device of an eighth preferred embodiment according to the present invention.

FIG. 36 is a cross-sectional view showing a configuration of a semiconductor device 100G of an eighth preferred embodiment according to the present invention. As shown in FIG. 36, in the semiconductor device 100G, in the semiconductor device 100 of the first preferred embodiment shown in FIG. 8, an upper layer part of the impurity region 3a is provided with an impurity region 4 (second region) separately from the impurity region 4 (first region) connected with the source electrode 6, and a short electrode 13 is provided so as to straddle from the impurity region 4 to the impurity region 3a. Note that the short electrode 13 is provided to short-circuit the impurity region 4 and the impurity region 3a.

Figure 37:
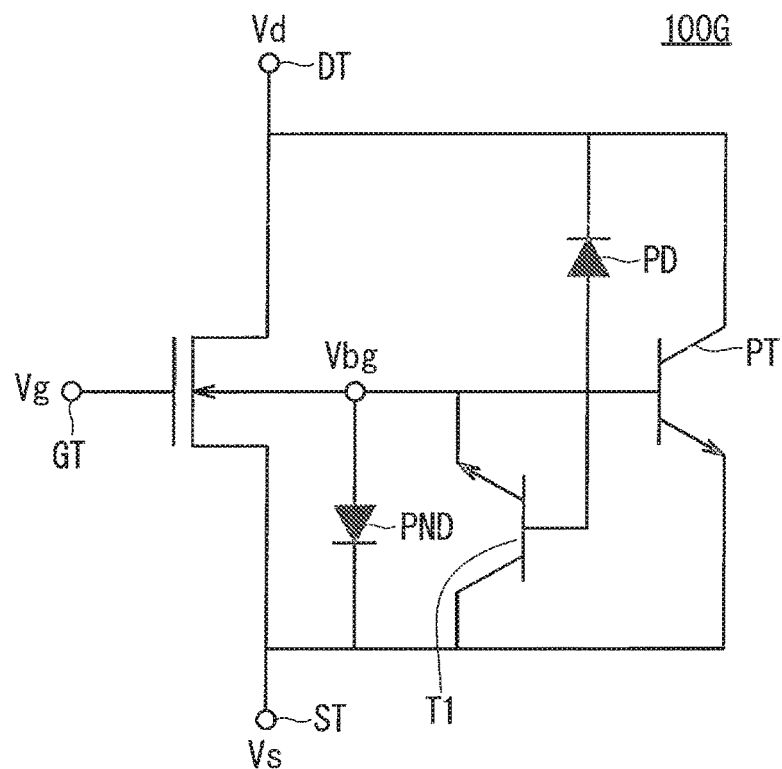
FIG. 37 is an equivalent circuit diagram of the semiconductor device of the eighth preferred embodiment according to the present invention.

FIG. 37 is an equivalent circuit diagram of the semiconductor device 100G. As shown in FIG. 37, between a back gate of a MOS transistor and a source terminal ST, a pn junction diode PND is formed, and an npn transistor T1 in which an emitter and a base are short-circuited is added in parallel with the pn junction diode PND.

By adopting such a configuration, when a negative bias is applied to the back gate, the negative bias is clamped by a punch-through voltage between the impurity regions 4, and a decrease in a back gate voltage Vbg is suppressed.

In the semiconductor device 100 of the first preferred embodiment, the back gate voltage Vbg decreases when the drain voltage Vd changes in a direction of applying a forward bias to the parasitic diode PD, but the decrease stops at a pn junction breakdown voltage of the pn junction diode PND. However, if this pn junction breakdown voltage is too high, an effective threshold value Vth increases, and a gate voltage Vg that is equal to or higher than a standard upper limit value is required to turn ON the MOS transistor in this state.

Whereas, in the semiconductor device 100G, a decrease in the back gate voltage Vbg is suppressed by punch-through between the impurity regions 4. Therefore, excessive increase of an effective threshold value Vth is suppressed, and it is possible to avoid deterioration of the gate insulating film OX and dielectric breakdown due to application of a gate voltage Vg equal to or higher than a standard upper limit.

Further, FIG. 36 shows a configuration in which two impurity regions 4 are provided in the upper layer part of the common impurity region 3a. However, a configuration may be adopted in which an impurity region 4 connected with the short electrode 13 and an impurity region 4 connected with the source electrode 6 are provided in separate impurity regions 3a, and the impurity regions 3a are short-circuited.

Ninth Preferred Embodiment

Figure 38:
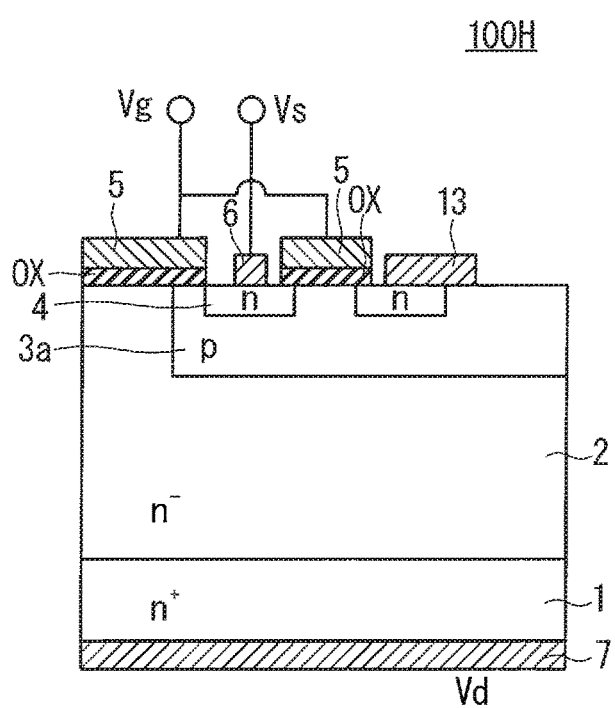
FIG. 38 is a cross-sectional view showing a configuration of a semiconductor device of a ninth preferred embodiment according to the present invention.

FIG. 38 is a cross-sectional view showing a configuration of a semiconductor device 100H of a ninth preferred embodiment according to the present invention. As shown in FIG. 38, in the semiconductor device 100H, in the semiconductor device 100 of the first preferred embodiment shown in FIG. 8, the upper layer part of the impurity region 3a is provided with an impurity region 4 (second region) separately from the impurity region 4 (first region) connected with the source electrode 6, and a short electrode 13 is provided so as to straddle from the impurity region 4 to the impurity region 3a. Then, a MOS transistor is added by forming a gate electrode 5 so as to straddle between peripheral portions of the two impurity regions 4 with a gate insulating film OX interposed in between. Note that the gate electrode 5 of the added MOS transistor is short-circuited with the gate electrode 5 of the semiconductor device 100H.

By adopting such a configuration, in a situation where the back gate voltage Vbg decreases, since a positive bias of the same value as the decreased back gate voltage Vbg is relatively applied to a gate of the added MOS transistor, the added MOS transistor is turned ON when the gate voltage of the added MOS transistor reaches a threshold value. In this state, since a large current flows when the gate voltage is to exceed the threshold value, fluctuation in the back gate voltage Vbg is suppressed near the threshold value. Therefore, it is possible to avoid deterioration of the gate insulating film OX and dielectric breakdown, and suppress an unstable operation of the MOS transistor and decrease in an allowable time at a time of power supply short circuit due to a current change caused by fluctuation of the back gate voltage Vbg.

Further, as described with reference to FIG. 12, when the drain voltage Vd decreases and becomes a negative bias, the back gate voltage Vbg also decreases and becomes a negative bias to some extent. This is because the impurity region 3a is floating, and the negative bias of the back gate remains even if a gate terminal GT is returned to 0 V. When the negative bias of the back gate remains, a substantial threshold value is increased by a back gate bias effect.

Whereas, in the semiconductor device 100H, when the gate terminal GT is set to a positive bias by a synchronous rectification operation, the added MOS transistor is also turned ON, and the impurity region 3a and the impurity region 4 are short-circuited via the short electrode 13. Therefore, after the synchronous rectification is completed, the back gate bias effect is lost. Therefore, even if the added MOS transistor is turned OFF after the synchronous rectification, deterioration of a hole injection suppression effect can be avoided since the back gate bias effect has been eliminated.

Tenth Preferred Embodiment

FIG. 39 is a cross-sectional view showing a configuration of a semiconductor device 100I of a tenth preferred embodiment according to the present invention. A semiconductor device 100I shown in FIG. 39 is obtained by applying the semiconductor device 100 of the first preferred embodiment shown in FIG. 8 to a trench type semiconductor device.

As shown in FIG. 39, the semiconductor device 100I is the same as the semiconductor device 100 in that a p-type impurity region 3a is formed in an upper layer part of an epitaxial layer 2, and an n-type impurity region 4 is formed in an upper layer part of the impurity region 3a. However, there is provided a trench TR reaching from an outermost surface of the epitaxial layer 2 to a depth exceeding a bottom surface of the impurity region 3a, so as to be in contact with side surfaces of the impurity region 3a and the impurity region 4. Then, a gate insulating film OX is provided so as to cover an inner surface of the trench TR, and a gate electrode 5 is filled in the trench TR covered with the gate insulating film OX. In addition, the same components as those of the semiconductor device 100 are denoted by the same reference numerals, and redundant description will be omitted.

Thus, even in the trench type semiconductor device, a source electrode 6 is configured to be in contact with the impurity region 4 alone. However, since a lifetime of the impurity region 3a is shortened such that Ic/Ie is $1/1000$ or less in an emitter current Ie and a collector current Ic of a parasitic npn transistor, an operation of the parasitic npn transistor can be suppressed. Further, by setting a junction breakdown voltage of a pn junction diode to Vth or higher, the semiconductor device 100I is automatically turned ON when a drain voltage Vd becomes lower than −Vth, and a current flows through a channel of the semiconductor device 100I. Therefore, hole injection from the impurity region 3a into the epitaxial layer 2 is suppressed. This suppresses occurrence of energy loss due to a transient reverse flow of holes when a parasitic diode PD of the semiconductor device 100I returns to a reverse bias again from a forward bias. Further, even in a case where there is a parasitic resistance between a source and a back gate, a forward bias is not generated between an emitter and a base of the parasitic npn transistor, and the parasitic npn transistor is not to be turned ON. This suppresses the parasitic npn transistor from being turned ON, and an occurrence of power supply short circuit can be avoided, in a case where the semiconductor device 100I configures an inverter.

Meanwhile, a p-type impurity region is provided at a bottom part of the trench TR to inhibit dielectric breakdown of the gate insulating film OX at the bottom part of the trench, and a p-type impurity region may be provided along a side surface of the trench TR for causing the impurity region to short-circuit with the impurity region 3a.

In the first to tenth preferred embodiments described above, the substrate 1 is a Si substrate or a SiC substrate, but may be a semiconductor substrate such as a GaN substrate or may have a configuration in which a multilayer epitaxial layer is formed on a semiconductor substrate such as a Si substrate, a SiC substrate, or a GaN substrate, and then the semiconductor substrate is removed by mechanical, chemical, or other method to provide an epitaxial layer alone. In that case, the substrate 1 can be called a semiconductor layer containing n-type impurities at a relatively high concentration.

It should be noted that the present invention can freely combine each preferred embodiment within the scope of the invention, and can deform or omit each preferred embodiment as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a MOS transistor comprising:
   a first semiconductor layer of a first conductivity type;
   a second semiconductor layer of a first conductivity type provided on a first main surface of the first semiconductor layer and having a first conductivity type impurity concentration lower than that of the first semiconductor layer;
   a first impurity region of a second conductivity type provided in an upper layer part of the second semiconductor layer;
   a second impurity region of a first conductivity type provided in an upper layer part of the first impurity region;
   a gate electrode provided to face at least the first impurity region and the second semiconductor layer with a gate insulating film interposed in between;
   a first main electrode that is at least partially connected to the second impurity region and provided to be not in contact with the first impurity region; and
   a second main electrode connected to a second main surface of the first semiconductor layer on a side opposite to a side provided with the first main electrode, wherein
   a parasitic transistor is configured with the second impurity region as an emitter, the first semiconductor layer and the second semiconductor layer as a collector, and the first impurity region as a base,
   a parasitic diode is configured with the first impurity region as an anode, and the first semiconductor layer and the second semiconductor layer as a cathode,
   a pn junction diode is configured with the first impurity region as an anode, and the second impurity region as a cathode,
   a ratio of a collector current to an emitter current of the parasitic transistor is $1/1000$ or less, and
   a junction breakdown voltage of the pn junction diode is equal to or larger than a threshold value of a gate voltage for turning ON the MOS transistor.

2. The semiconductor device according to claim 1, wherein
   the first main electrode is provided to have a connecting part connected to the first impurity region via a resistor.

3. The semiconductor device according to claim 2, wherein
   in the connecting part of the first main electrode,
   the first main electrode and the first impurity region are in direct contact with each other, and
   the resistor is configured by a contact resistor.

4. The semiconductor device according to claim 1, further comprising
   a MOS capacitor provided between the first main electrode and the first impurity region.

5. The semiconductor device according to claim 1, wherein
   the second impurity region comprises:
   a first region to be connected with the first main electrode; and
   a second region provided apart from the first region, and
   the semiconductor device further comprises a short electrode provided on the second region and on the first impurity region, and short-circuiting the second region and the first impurity region.

6. The semiconductor device according to claim 5, wherein
   the gate electrode is also provided between peripheral portions of the first and second regions with the gate insulating film interposed in between.

7. The semiconductor device according to claim 1, wherein
   the gate electrode is provided in a trench that is provided in the second semiconductor layer to be in contact with side surfaces of the first and second impurity regions and to reach a depth exceeding a bottom surface of the first impurity region, with the gate insulating film interposed in between.

8. A semiconductor device comprising:
a MOS transistor comprising:
a first semiconductor layer of a first conductivity type;
a second semiconductor layer of a first conductivity type provided on a first main surface of the first semiconductor layer and having a first conductivity type impurity concentration lower than that of the first semiconductor layer;
a first impurity region of a second conductivity type provided in an upper layer part of the second semiconductor layer;
a second impurity region of a first conductivity type provided in an upper layer part of the first impurity region;
a gate electrode provided to face at least the first impurity region and the second semiconductor layer with a gate insulating film interposed in between;
a first main electrode that is at least partially connected to the second impurity region and is at least partially in Schottky connection with the first impurity region; and
a second main electrode connected to a second main surface of the first semiconductor layer on a side opposite to a side provided with the first main electrode, wherein
a parasitic transistor is configured with the second impurity region as an emitter, the first semiconductor layer and the second semiconductor layer as a collector, and the first impurity region as a base,
a parasitic diode is configured with the first impurity region as an anode, and the first semiconductor layer and the second semiconductor layer as a cathode,
a Schottky diode is configured with the first impurity region as an anode, and the first main electrode as a cathode, and
the first main electrode is connected to the second impurity region and is provided so as to be Schottky connected to the first impurity region.

9. The semiconductor device according to claim 8, wherein
a ratio of a collector current to an emitter current of the parasitic transistor is $1/1000$ or less, and
a diode breakdown voltage of the Schottky diode is equal to or larger than a threshold value of a gate voltage for turning ON the MOS transistor.

10. A semiconductor device comprising:
a MOS transistor comprising:
a first semiconductor layer of a first conductivity type;
a second semiconductor layer of a first conductivity type provided on a first main surface of the first semiconductor layer and having a first conductivity type impurity concentration lower than that of the first semiconductor layer;
a first impurity region of a second conductivity type provided in an upper layer part of the second semiconductor layer;
a second impurity region of a first conductivity type provided in an upper layer part of the first impurity region;
a gate electrode provided to face at least the first impurity region and the second semiconductor layer with a gate insulating film interposed in between;
a narrow band gap layer of a first conductivity type that is at least partially connected to the first impurity region, and has a narrower band gap than that of the first impurity region;
a first main electrode that is at least partially connected to the narrow band gap layer and provided to be not in contact with the first impurity region; and
a second main electrode connected to a second main surface of the first semiconductor layer on a side opposite to a side provided with the first main electrode, wherein
a parasitic transistor is configured with the second impurity region as an emitter, the first semiconductor layer and the second semiconductor layer as a collector, and the first impurity region as a base,
a parasitic diode is configured with the first impurity region as an anode, and the first semiconductor layer and the second semiconductor layer as a cathode, and
a pn junction diode is configured with the first impurity region as an anode, and the narrow band gap layer as a cathode.

11. The semiconductor device according to claim 10, wherein
a ratio of a collector current to an emitter current of the parasitic transistor is $1/1000$ or less, and
a junction breakdown voltage of the pn junction diode is equal to or larger than a threshold value of a gate voltage for turning ON the MOS transistor.

12. A semiconductor device comprising:
a MOS transistor comprising:
a first semiconductor layer of a first conductivity type;
a second semiconductor layer of a first conductivity type provided on a first main surface of the first semiconductor layer and having a first conductivity type impurity concentration lower than that of the first semiconductor layer;
a first impurity region of a second conductivity type provided in an upper layer part of the second semiconductor layer;
a second impurity region of a first conductivity type provided in an upper layer part of the first impurity region;
a third impurity region of a second conductivity type positioned at an upper surface of the second semiconductor layer and within an upper layer part of the second impurity region;
a gate electrode provided to face the first impurity region and the second semiconductor layer with a gate insulating film interposed in between;
a first main electrode that is at least partially connected to the second impurity region and provided to be not in contact with the first impurity region and the third impurity region; and
a second main electrode connected to a second main surface of the first semiconductor layer on a side opposite to a side provided with the first main electrode, wherein
a parasitic transistor is configured with the second impurity region as an emitter, the first semiconductor layer and the second semiconductor layer as a collector, and the first impurity region as a base,
a parasitic diode is configured with the first impurity region as an anode, and the first semiconductor layer and the second semiconductor layer as a cathode,
a first pn junction diode configured with the third impurity region as an anode, and the second impurity region as a cathode,
a second pn junction diode is configured with the first impurity region as an anode, and the second impurity region as a cathode, a ratio of a collector current to an emitter current of the parasitic transistor is $\frac{1}{1000}$ or less, and a junction breakdown voltage of the first pn junction diode is equal to or larger than a threshold value of a gate voltage for turning ON the MOS transistor, and equal to or smaller than a maximum voltage that can be applied to the gate electrode of the MOS transistor.

13. A semiconductor device comprising:

a MOS transistor comprising:
- a first semiconductor layer of a first conductivity type;
- a second semiconductor layer of a first conductivity type provided on a first main surface of the first semiconductor layer and having a first conductivity type impurity concentration lower than that of the first semiconductor layer;
- a first impurity region of a second conductivity type provided in an upper layer part of the second semiconductor layer;
- second impurity regions of a first conductivity type provided in an upper layer part of the first impurity region;
- a third impurity region of a second conductivity type having a higher impurity concentration of the second conductivity type than that of the first impurity region and provided adjacent to the second impurity regions provided in the upper layer of the first impurity region;
- a gate electrode provided to face the first impurity region and the second semiconductor layer with a gate insulating film interposed in between;
- a first main electrode that is at least partially connected to the second impurity regions and provided to be not in contact with the first impurity region and the third impurity region; and
- a second main electrode connected to a second main surface of the first semiconductor layer on a side opposite to a side provided with the first main electrode, wherein a parasitic transistor is configured with the second impurity regions as an emitter, the first semiconductor layer and the second semiconductor layer as a collector, and the first impurity region as a base, a parasitic diode is configured with the first impurity region as an anode, and the first semiconductor layer and the second semiconductor layer as a cathode, a first pn junction voltage clamping diode is configured with the third impurity region as an anode, and the second impurity regions as a cathode, the third impurity region is in physical contact with respective side surfaces of the second impurity regions, a ratio of a collector current to an emitter current of the parasitic transistor is $\frac{1}{1000}$ or less, and a junction breakdown voltage of the first pn junction voltage clamping diode is equal to or larger than a threshold value of a gate voltage for turning ON the MOS transistor, and equal to or smaller than a maximum voltage that can be applied to the gate electrode of the MOS transistor.

* * * * *